US012796401B2

(12) United States Patent
Ohtsuki et al.

(10) Patent No.: US 12,796,401 B2
(45) Date of Patent: Nov. 10, 2026

(54) METHOD FOR DRY-ETCHING SEMICONDUCTOR SUBSTRATE AND METHOD FOR DRY-ETCHING SILICON OXIDE FILM

(71) Applicant: SHIN-ETSU HANDOTAI CO., LTD., Tokyo (JP)

(72) Inventors: Tsuyoshi Ohtsuki, Annaka (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 707 days.

(21) Appl. No.: 17/920,937

(22) PCT Filed: Mar. 3, 2021

(86) PCT No.: PCT/JP2021/008288

§ 371 (c)(1),
(2) Date: Oct. 24, 2022

(87) PCT Pub. No.: WO2021/229898

PCT Pub. Date: Nov. 18, 2021

(65) Prior Publication Data

US 2023/0207399 A1 Jun. 29, 2023

(30) Foreign Application Priority Data

May 11, 2020 (JP) ................................ 2020-083309
Jun. 18, 2020 (JP) ................................ 2020-105267
Aug. 18, 2020 (JP) ................................ 2020-137855

(51) Int. Cl.
*H10P 74/20* (2026.01)
*G01N 21/35* (2014.01)
(Continued)

(52) U.S. Cl.
CPC ....... *H10P 74/203* (2026.01); *G01N 21/3563* (2013.01); *G01N 23/20* (2013.01);
(Continued)

(58) Field of Classification Search
CPC ............... H01L 22/12; H01L 21/31116; H01L 21/02052; H01L 22/10; G01N 21/3563;
(Continued)

(56) References Cited

U.S. PATENT DOCUMENTS 5,425,845 A * 6/1995 Wong ................ H01L 21/31116 438/743
5,595,916 A * 1/1997 Fujimura ........... G01B 11/0625 250/341.4
(Continued)

FOREIGN PATENT DOCUMENTS

JP H05-315317 A 11/1993
JP H08-041662 A 2/1996
(Continued)

OTHER PUBLICATIONS

Zamchiy et al., Determination of the Oxygen Content in Amorphous SiOx Thin Films, May 17, 2019, Journal of Non-Crystalline Solids (518), pp. 43-50 (Year: 2019).*
(Continued)

*Primary Examiner* — William B Partridge
*Assistant Examiner* — Erik A. Anderson
(74) *Attorney, Agent, or Firm* — Oliff PLC

(57) ABSTRACT

A method for dry-etching a semiconductor substrate having an oxide film, including: evaluating a film quality of the oxide film and determining a time for performing the dry-etching on a basis of results of the evaluation in advance. This provides a method for controlling the etching amount of an oxide film accurately and suppressing over-etching and insufficient etching without influence from
(Continued)

variation in the film quality of the oxide film when dry-etching the oxide film on the surface of the semiconductor substrate.

20 Claims, 15 Drawing Sheets

(51) Int. Cl.
*G01N 21/3563* (2014.01)
*G01N 23/20* (2018.01)
*H10P 50/28* (2026.01)

(52) U.S. Cl.
CPC .... *H10P 50/283* (2026.01); *G01N 2021/3595* (2013.01); *G01N 2223/6116* (2013.01)

(58) Field of Classification Search
CPC ........... G01N 23/20; G01N 2021/3595; G01N 2223/6116; H10P 74/203
See application file for complete search history.

(56) References Cited

U.S. PATENT DOCUMENTS

| | | | | |
|---|---|---|---|---|
| 5,653,894 | A | 8/1997 | Ibbotson et al. | |
| 5,658,418 | A | 8/1997 | Coronel et al. | |
| 2002/0119653 | A1 | 8/2002 | Yamane | |
| 2011/0240990 | A1* | 10/2011 | Yamazaki | H10D 30/6756<br>257/43 |
| 2015/0325435 | A1* | 11/2015 | Hollister | H10B 43/27<br>438/758 |
| 2018/0374863 | A1* | 12/2018 | Purayath | H10B 41/27 |
| 2021/0124233 | A1* | 4/2021 | Liang | G02F 1/035 |
| 2021/0305444 | A1* | 9/2021 | Seo | H10F 19/37 |
| 2021/0325725 | A1* | 10/2021 | Izawa | G02F 1/133526 |
| 2022/0214608 | A1* | 7/2022 | Shishido | G03F 1/32 |

FOREIGN PATENT DOCUMENTS

| | | | | | |
|---|---|---|---|---|---|
| JP | H08-264614 | A | | 10/1996 | |
| JP | H08-274082 | A | | 10/1996 | |
| JP | H08-330287 | A | | 12/1996 | |
| JP | 2002-134611 | A | | 5/2002 | |
| JP | 2003-001598 | A | | 1/2003 | |
| JP | 2004-296731 | A | | 10/2004 | |
| JP | 2005-079289 | A | | 3/2005 | |
| JP | 2005-345729 | A | | 12/2005 | |
| JP | 2006-073701 | A | | 3/2006 | |
| JP | 2006-332690 | A | | 12/2006 | |
| JP | 2012-004360 | A | | 1/2012 | |
| JP | 2017062462 | A | * | 3/2017 | G03F 1/20 |
| WO | WO-2020111422 | A1 | * | 6/2020 | H10F 19/10 |

OTHER PUBLICATIONS

Sep. 23, 2020 Office Action issued in Japanese Patent Application No. 2020-137855.

May 18, 2021 International Search Report issued in International Application No. PCT/JP2021/008288.

Nov. 15, 2022 International Preliminary Report on Patentability issued in International Application No. PCT/JP2021/008288.

Pan, P. et al., "The Composition and Properties of PECVD Silicon Oxide Films," J. Electrochem. Soc., vol. 132, No. 8, Aug. 1985, pp. 2012-2019.

Jul. 18, 2024 extended Search Report issued in European Patent Application No. 21804110.1.

May 23, 2024 Office Action issued in Taiwanese Patent Application No. 110108407.

Feb. 15, 2025 Office Action issued in Chinese Patent Application No. 202180031524.5.

May 10, 2025 Office Action issued in Korean Patent Application No. 2022-7038596.

* cited by examiner

[FIG. 1]
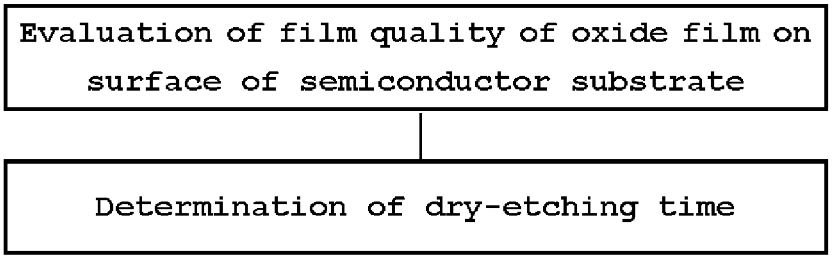
[FIG. 2]
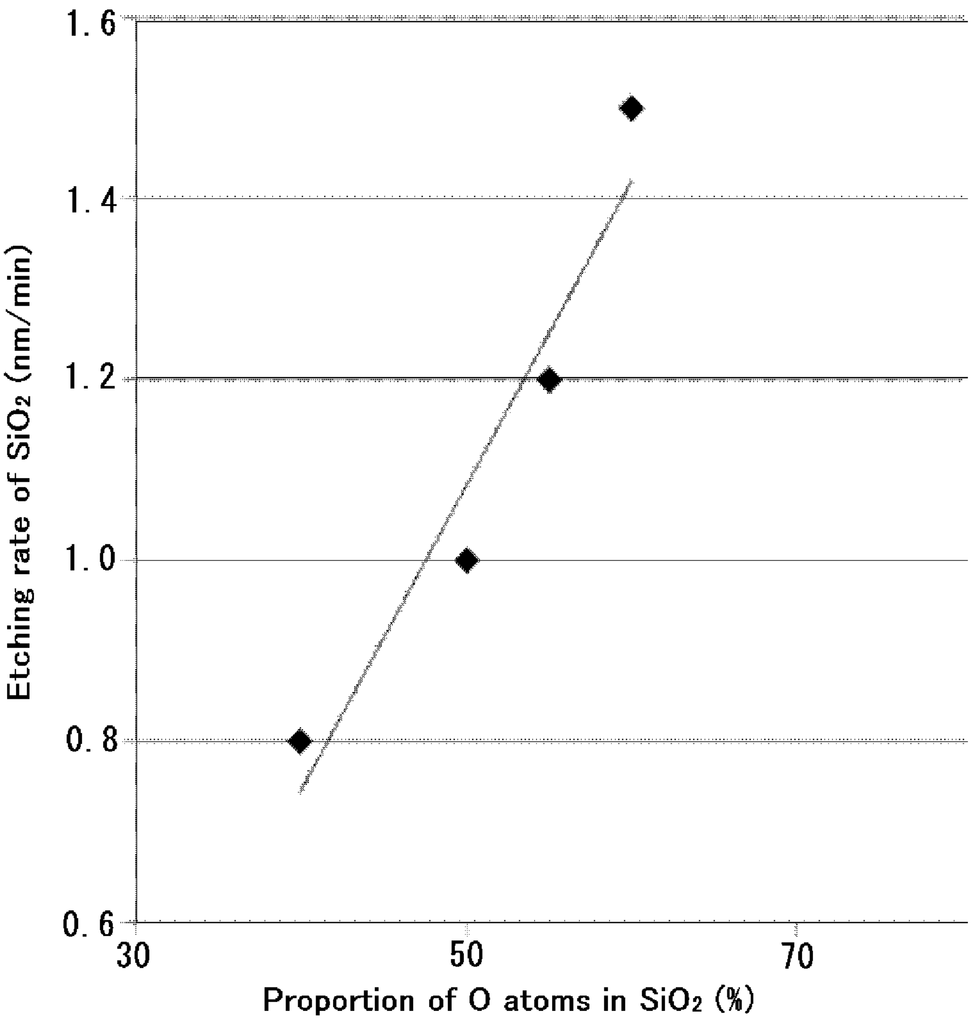

[FIG. 3]

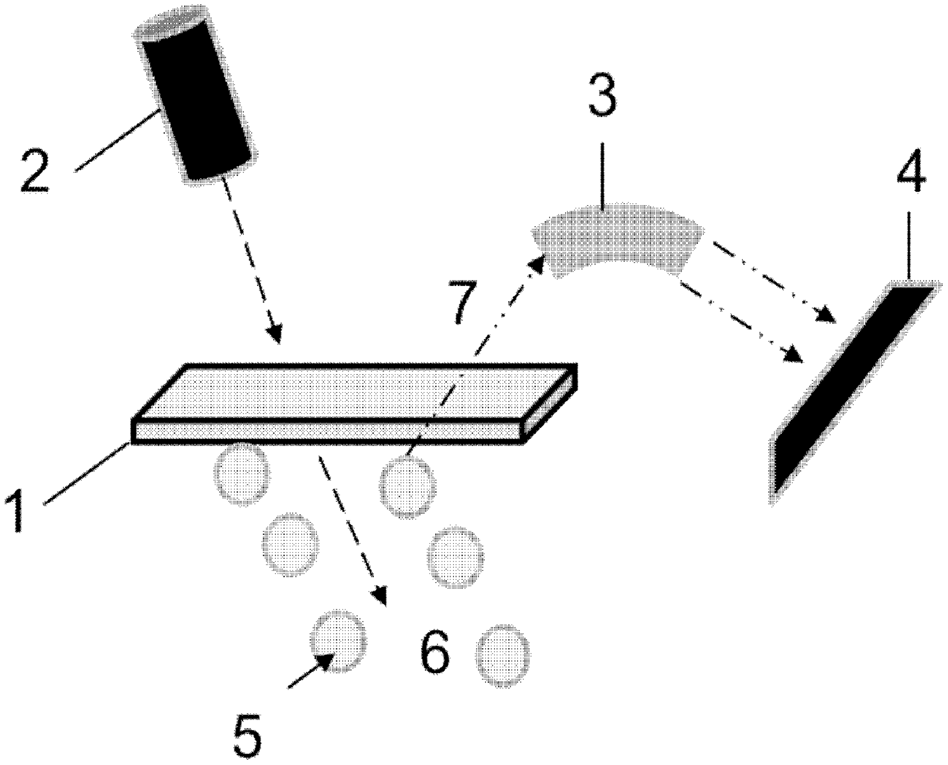

[FIG. 4]

Silicon substrates each having silicon oxide film having different oxygen proportion (x) are prepared.

Index indicating oxygen proportion (x) is obtained regarding each silicon oxide film.

Correlation between index indicating oxygen proportion (x) and etching rate is determined.

Index indicating oxygen proportion (x) is obtained regarding silicon oxide film on silicon substrate to be etched.

Etching time is adjusted and determined on basis of correlation and oxygen proportion (x) and dry etching is performed.

[FIG. 5]
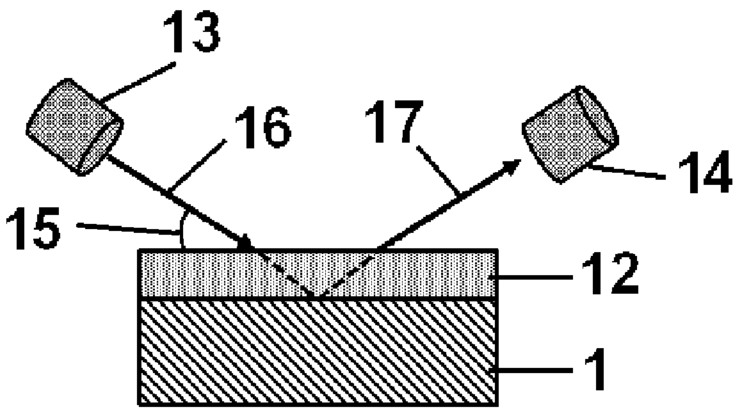
[FIG. 6]
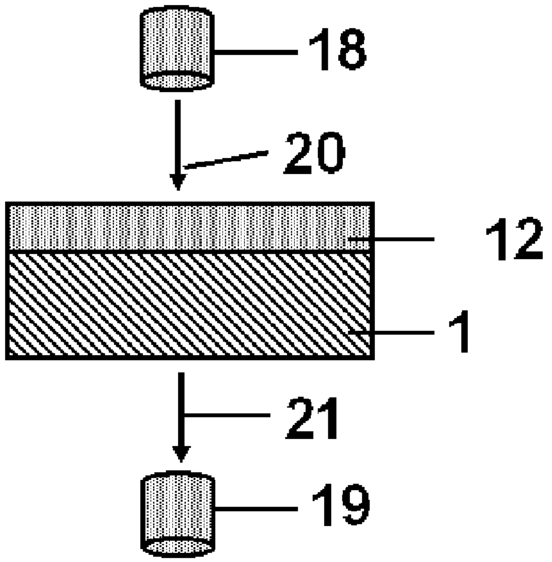

[FIG. 7]
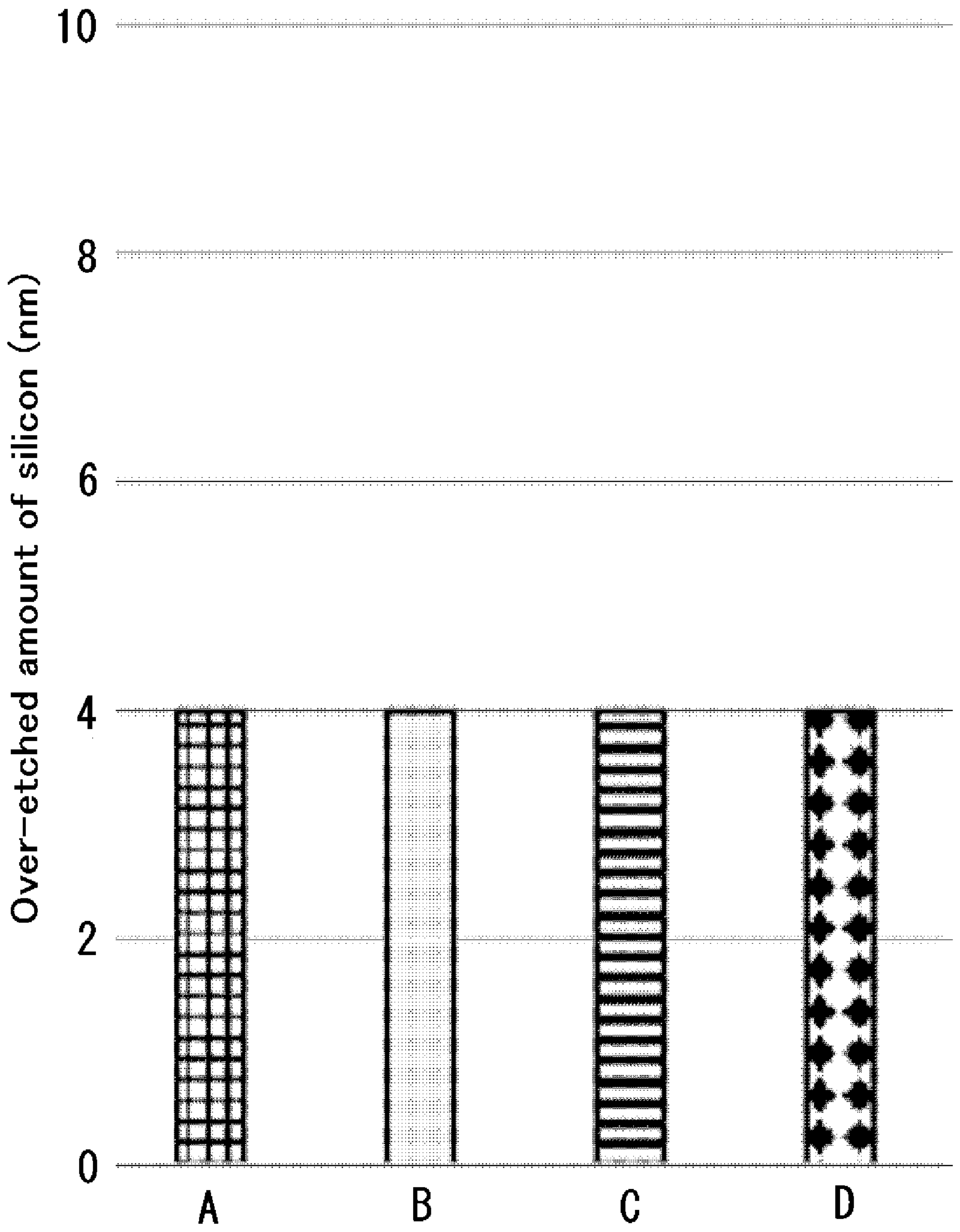

[FIG. 8]
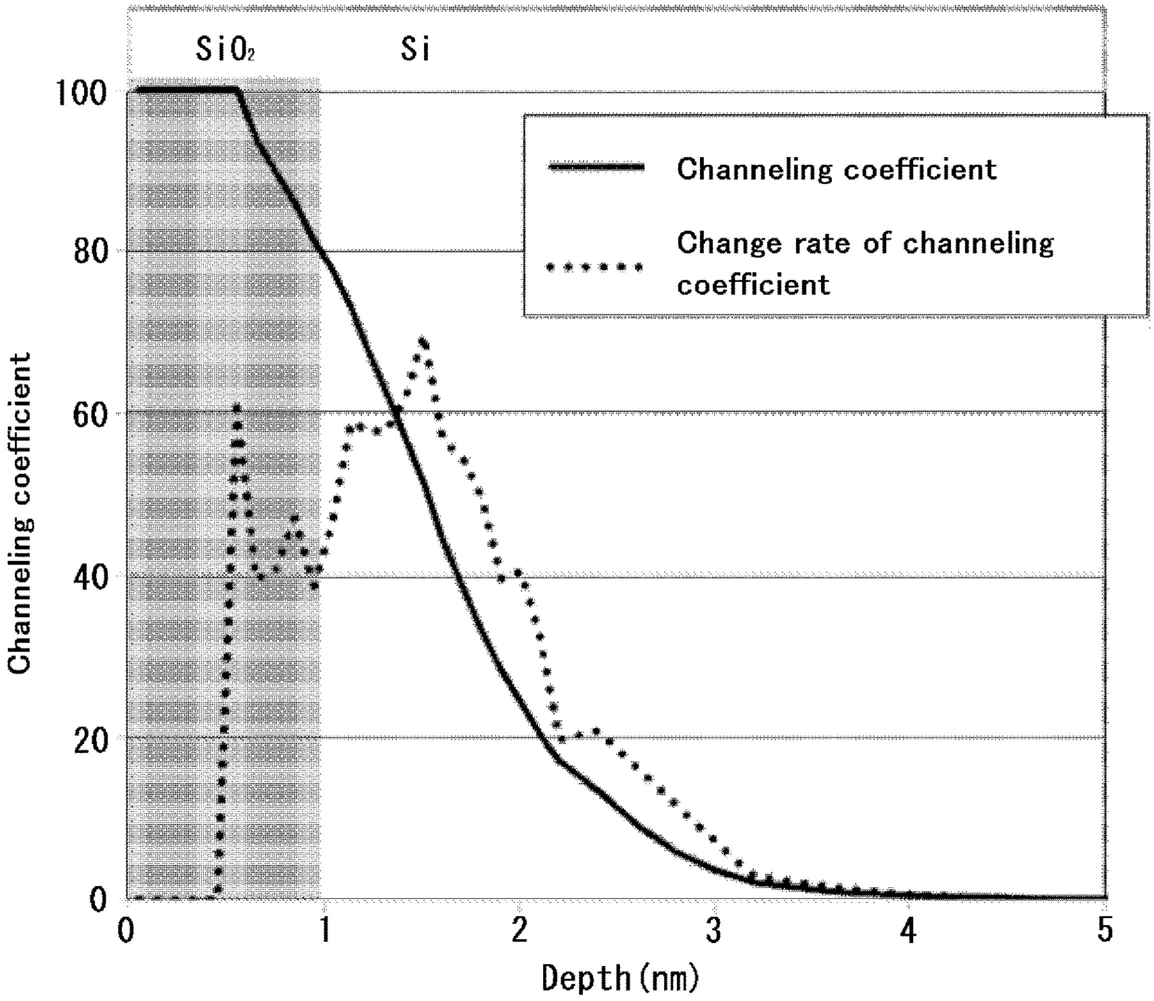

[FIG. 9]
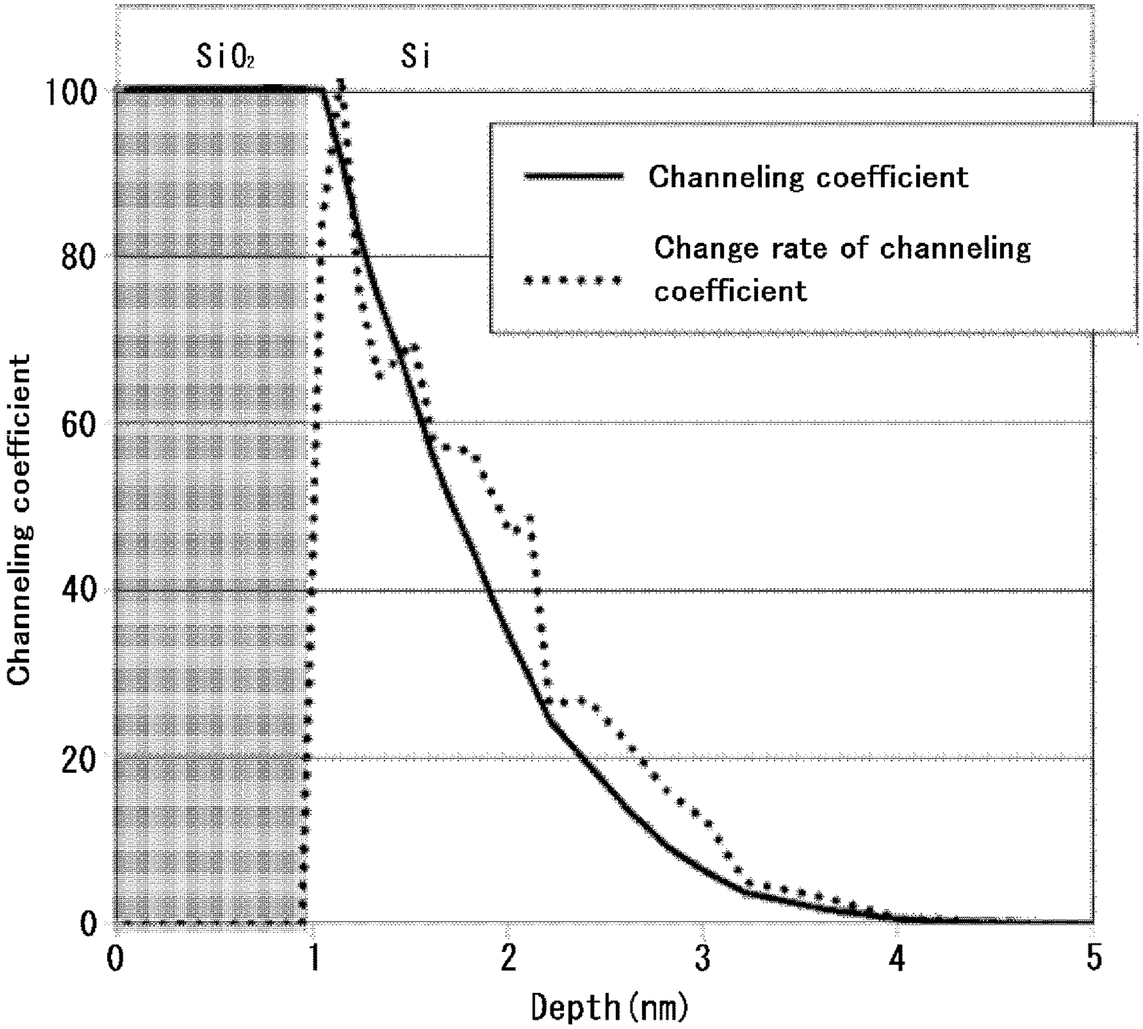

[FIG. 10]
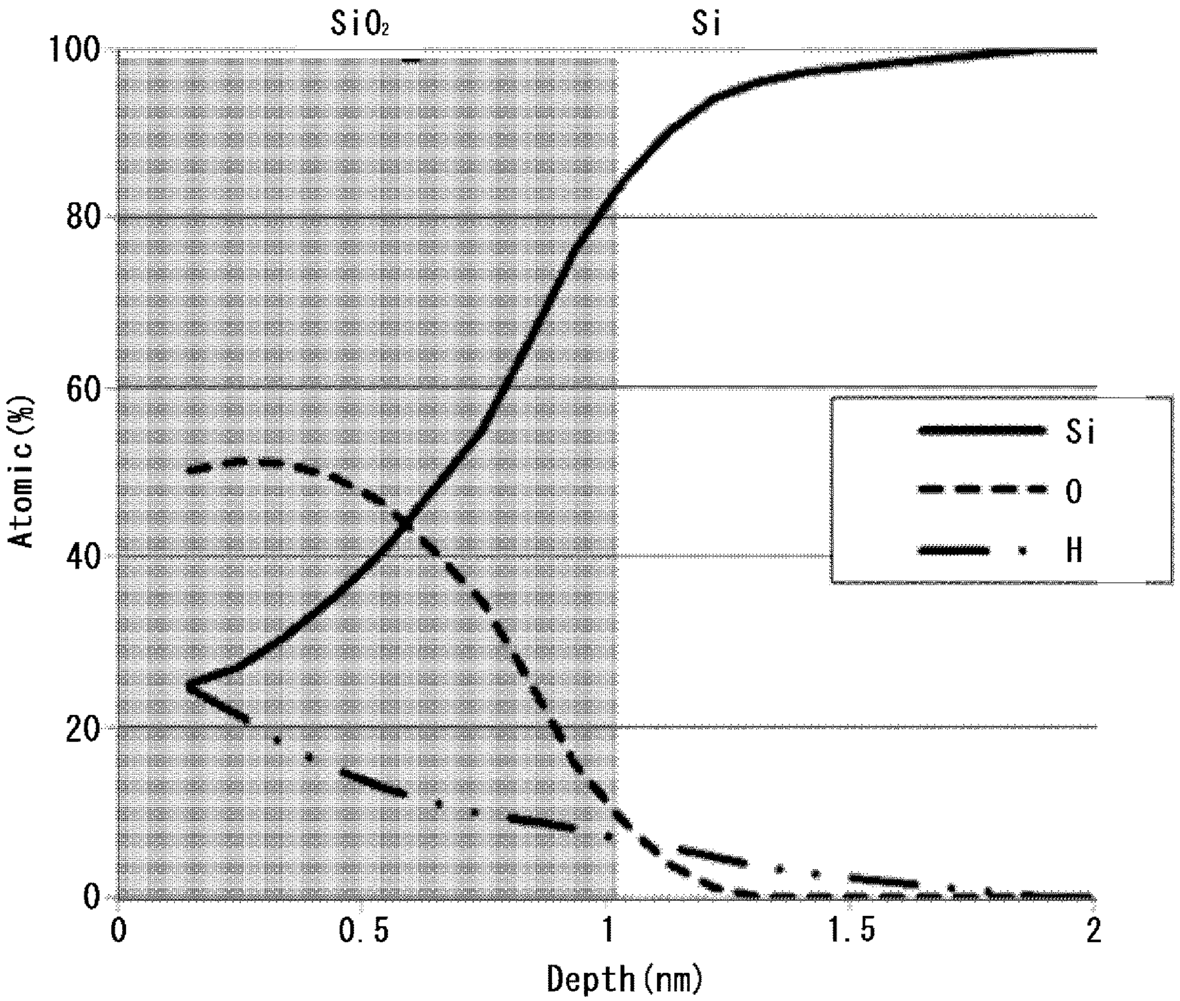

[FIG. 11]
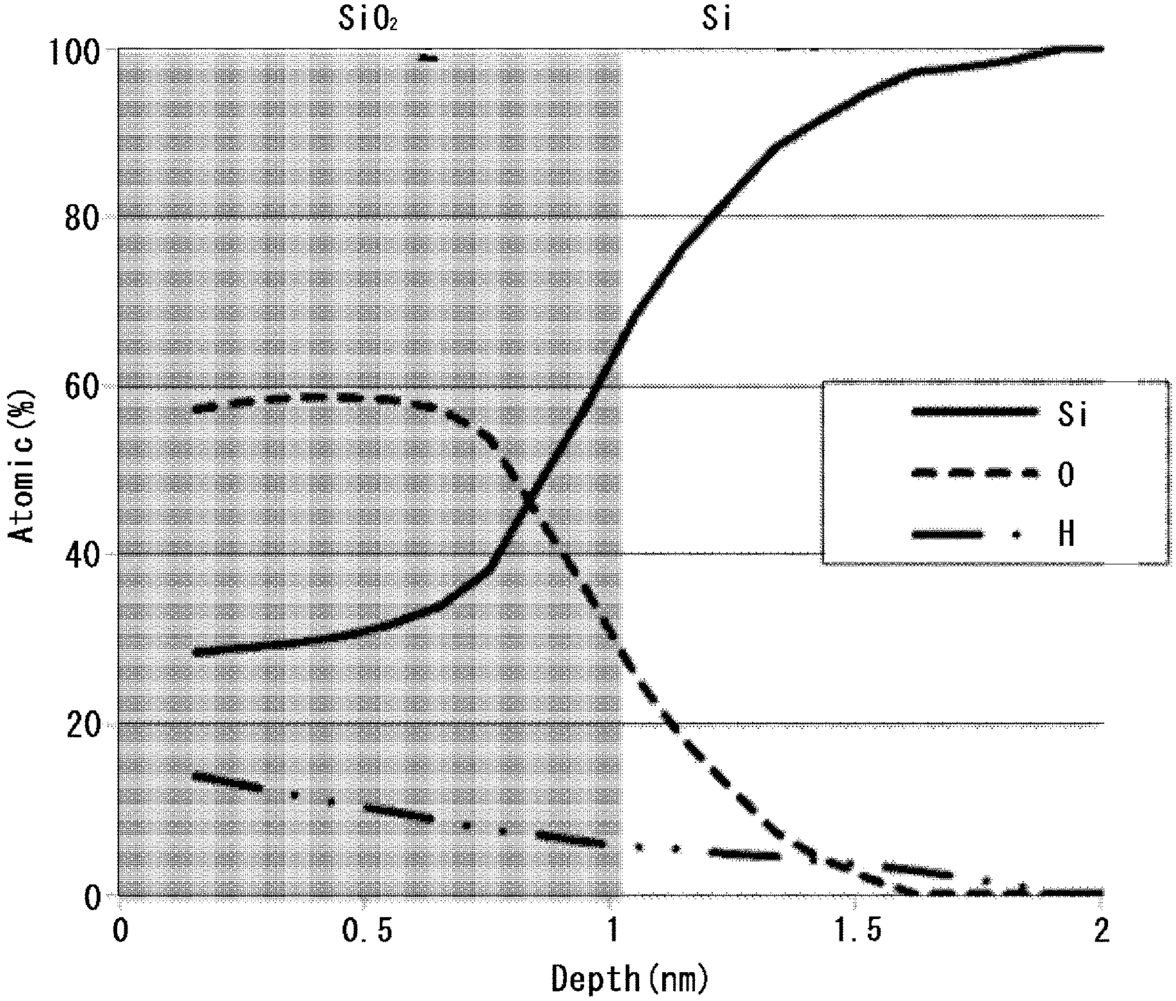

[FIG. 12]
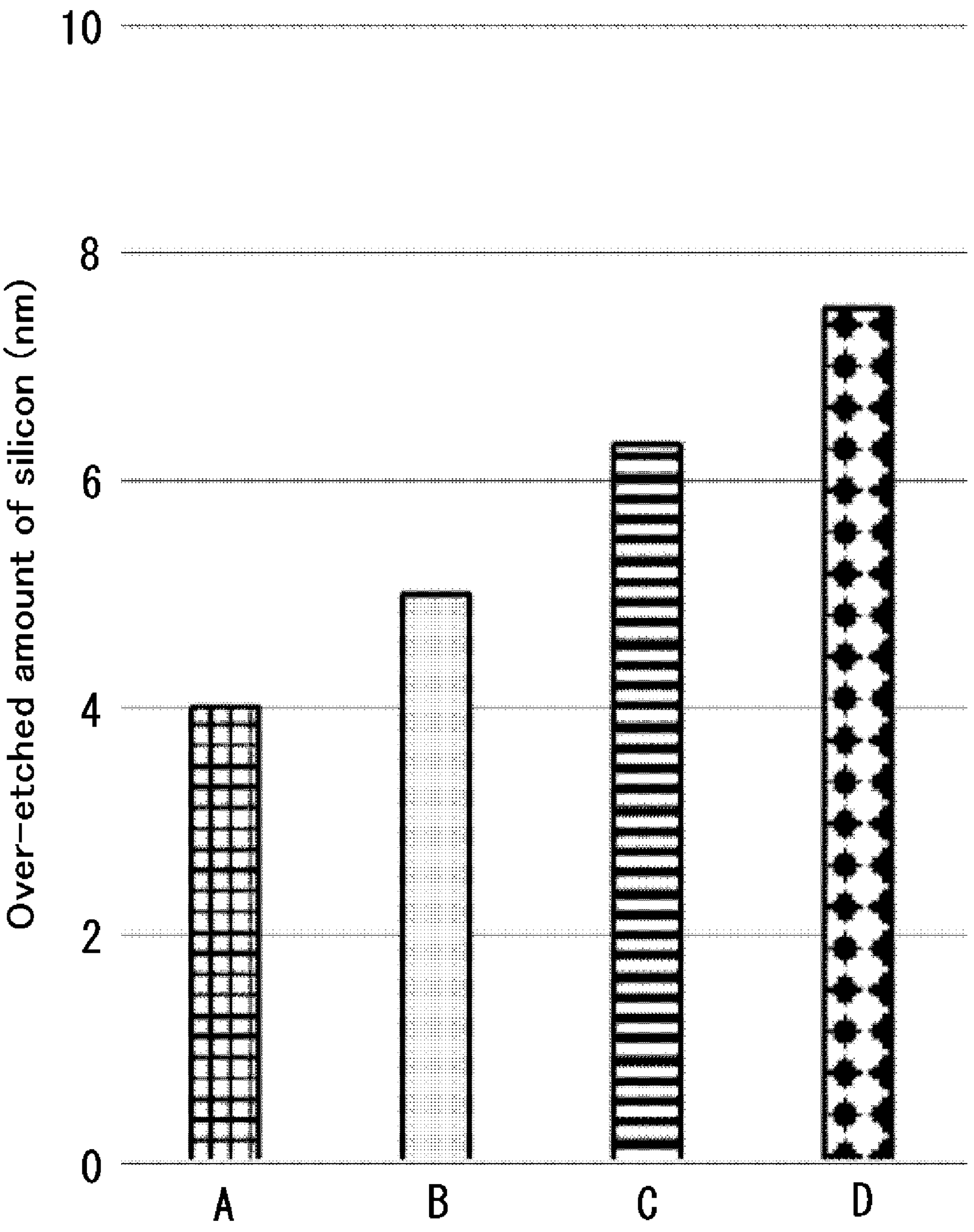

[FIG. 13]
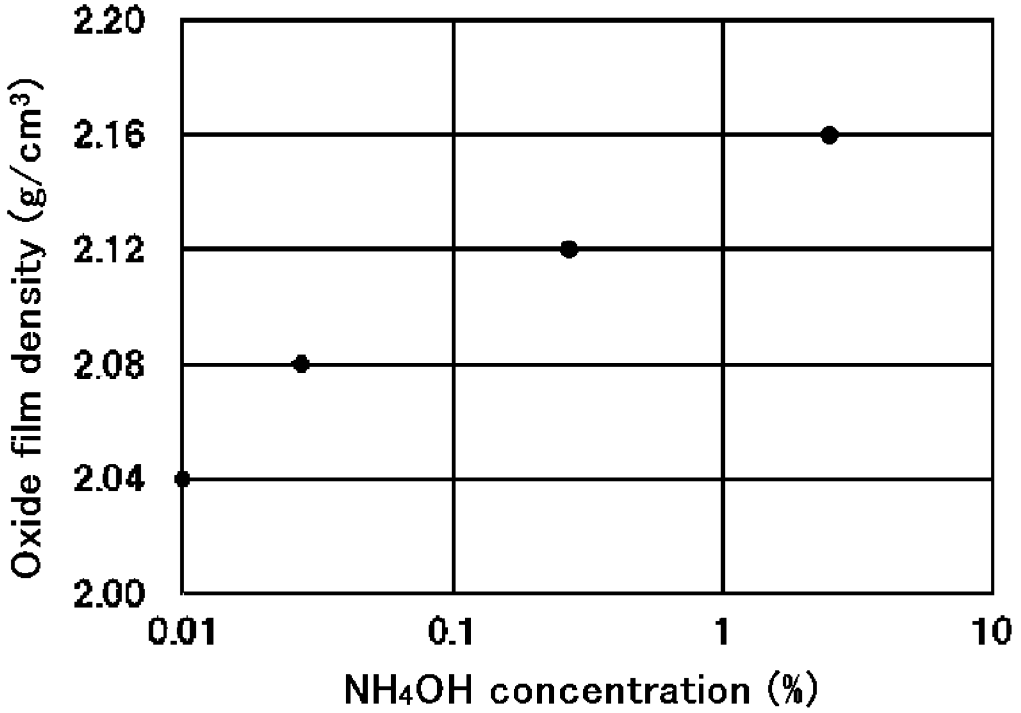
[FIG. 14]
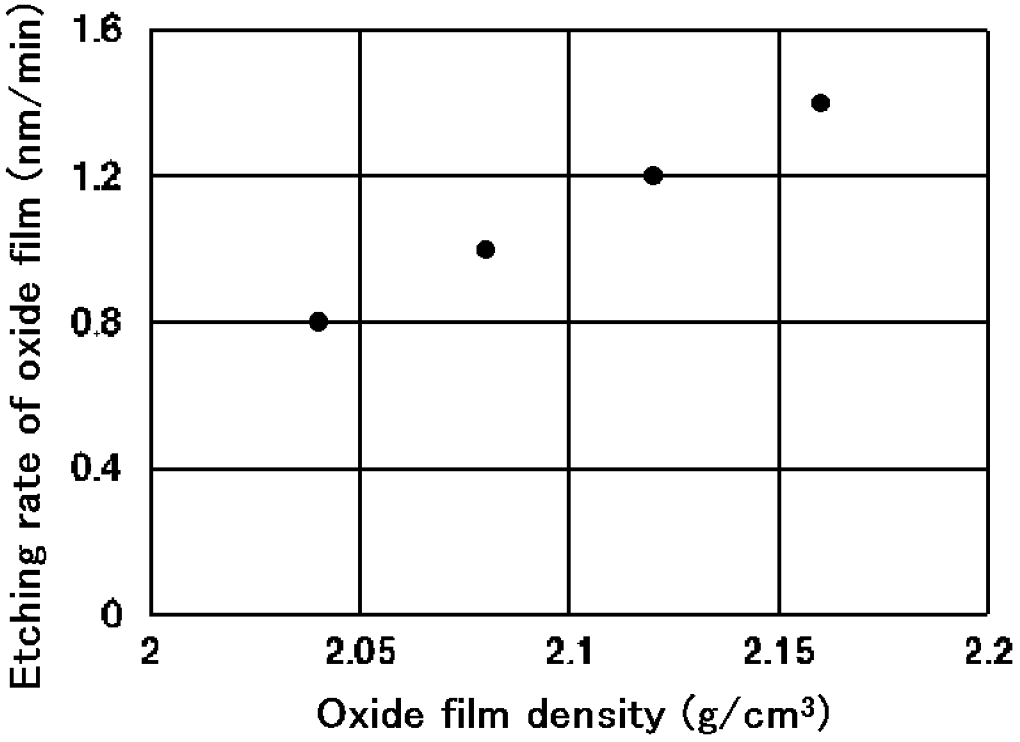

[FIG. 15]
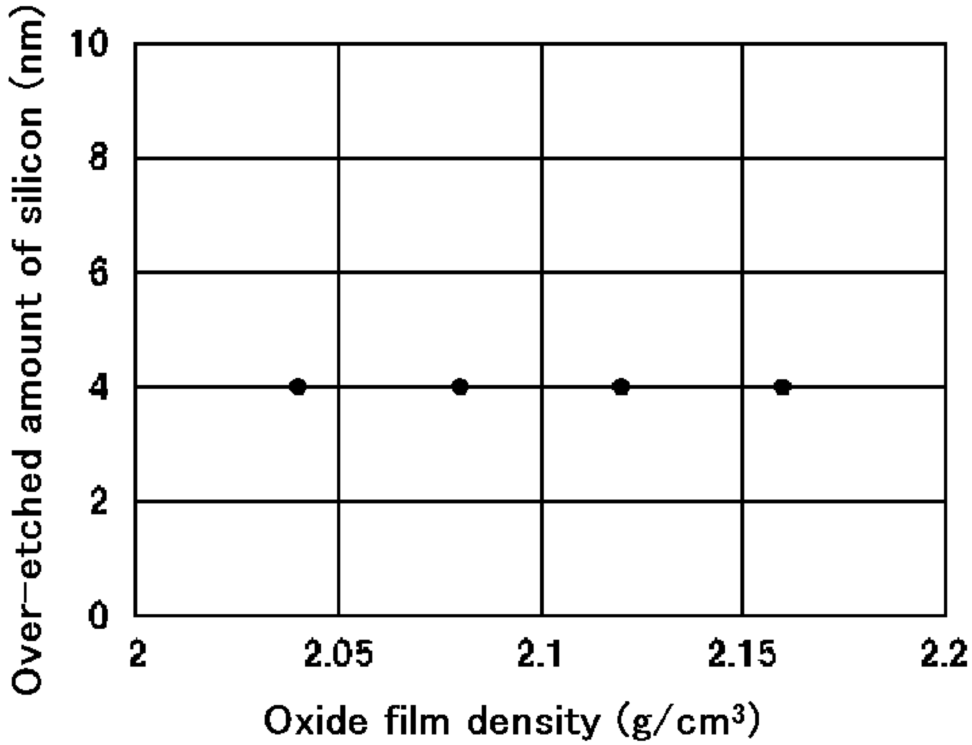
[FIG. 16]
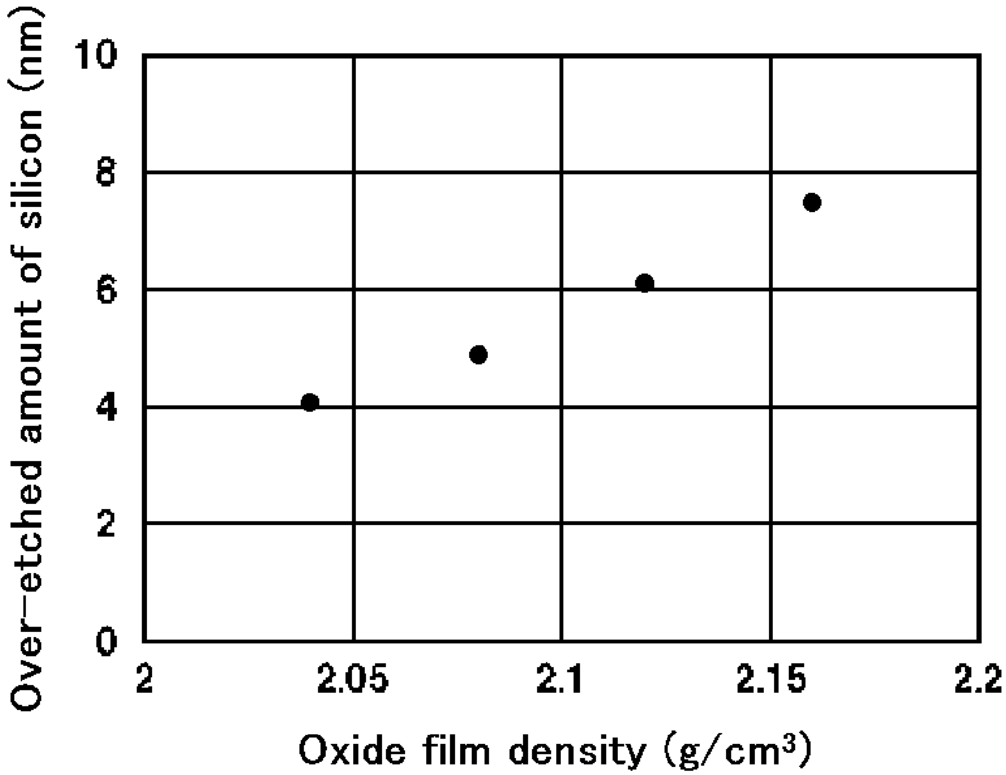

[FIG. 17]
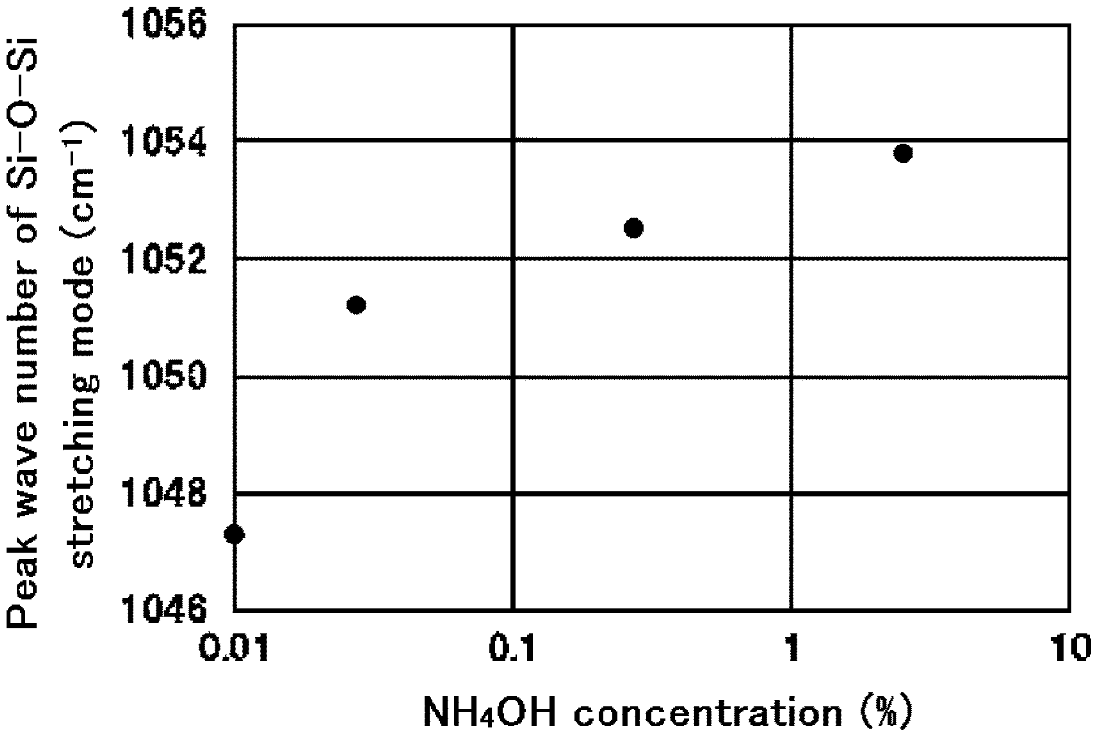
[FIG. 18]
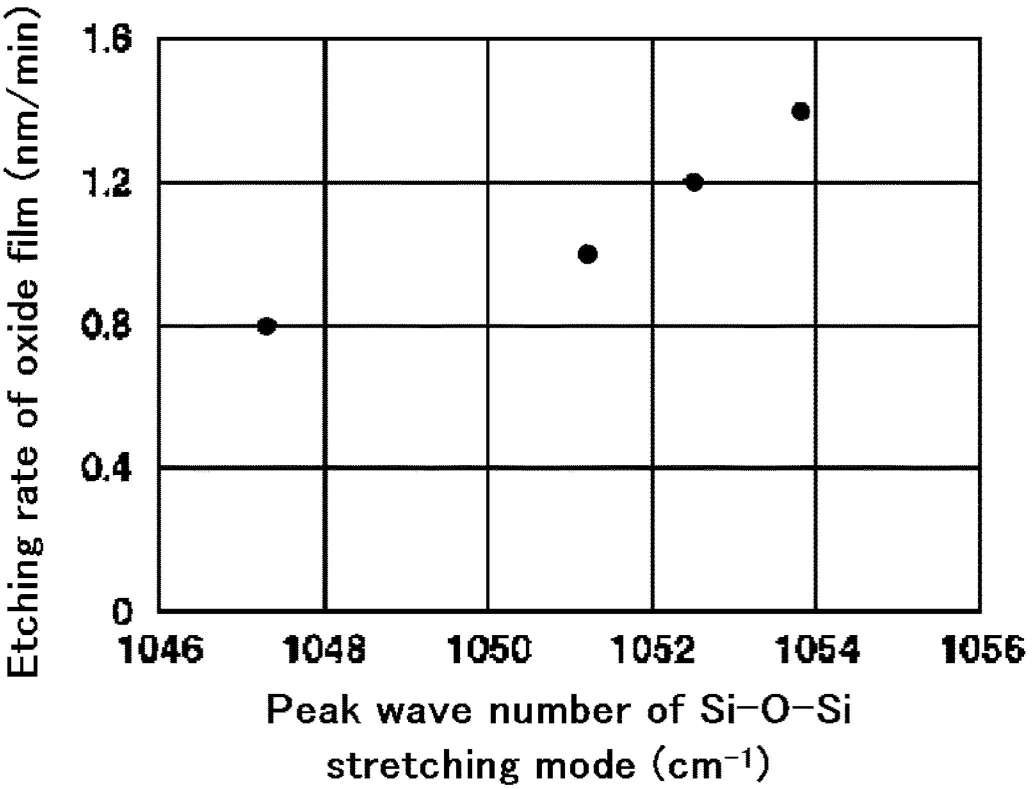

[FIG. 19]
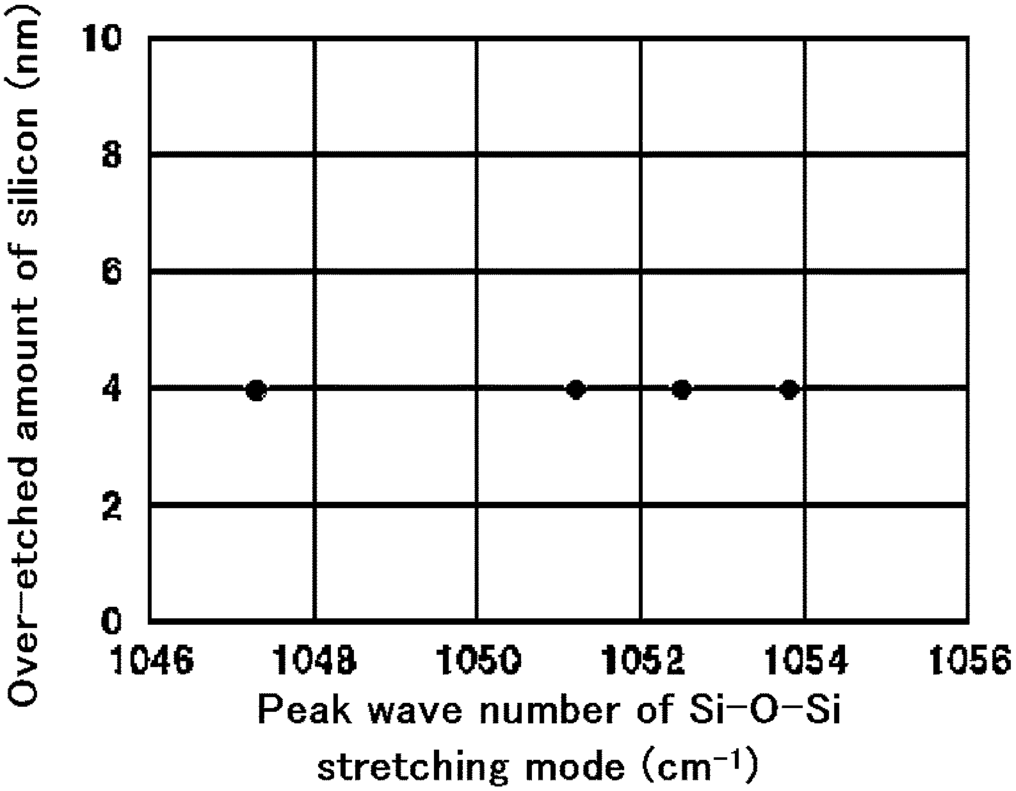
[FIG. 20]
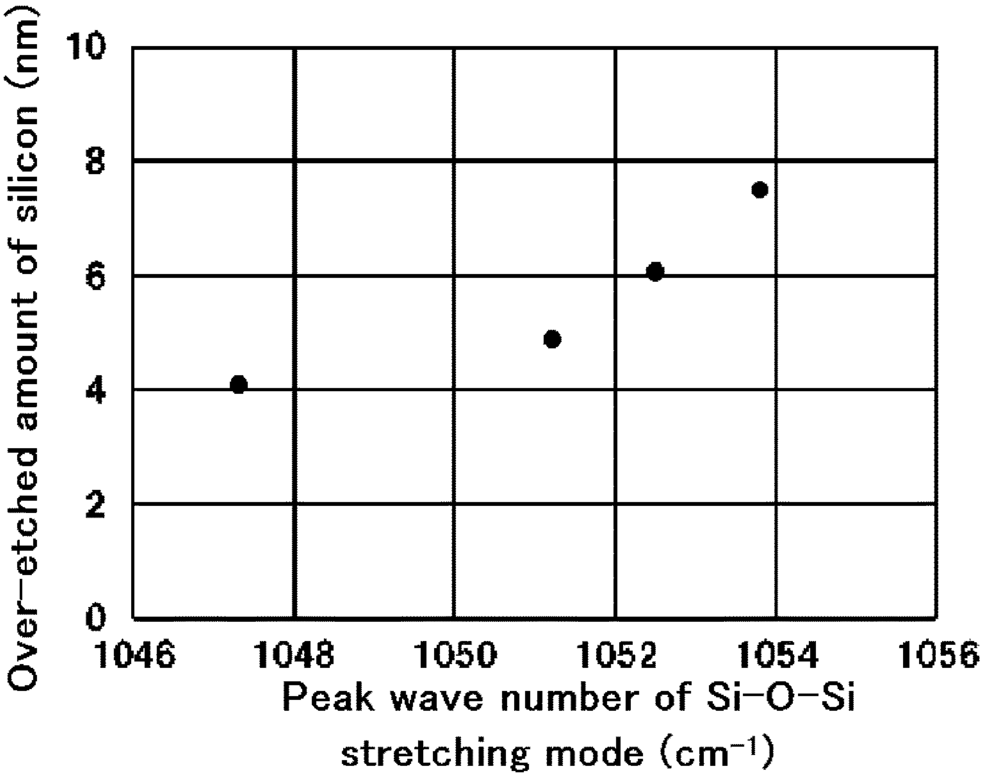

[FIG. 21]
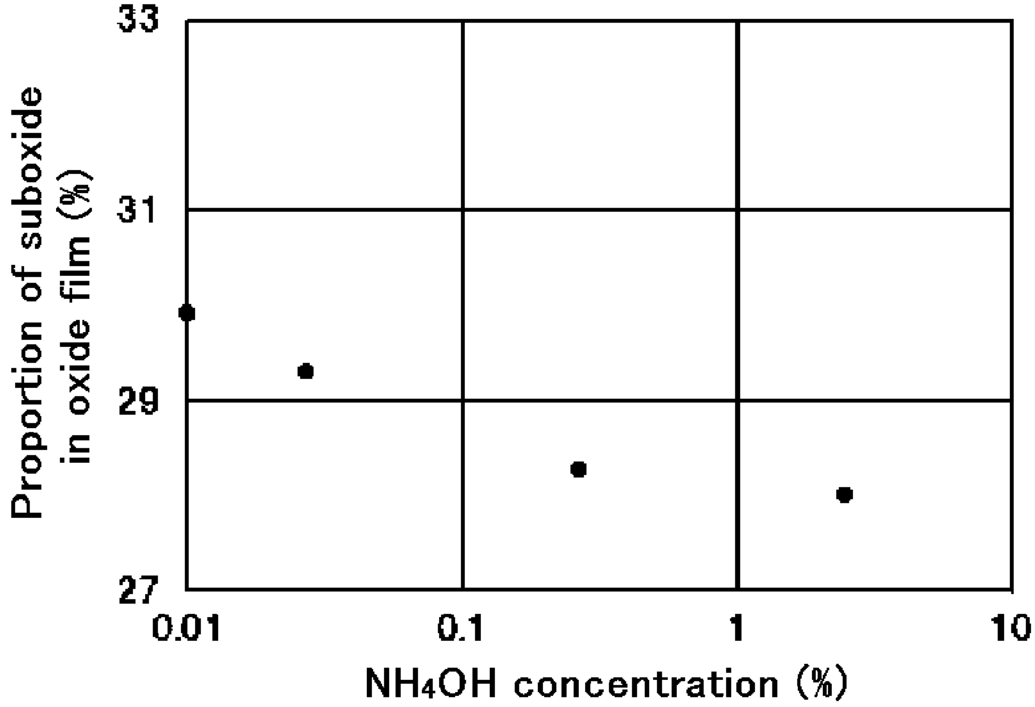
[FIG. 22]
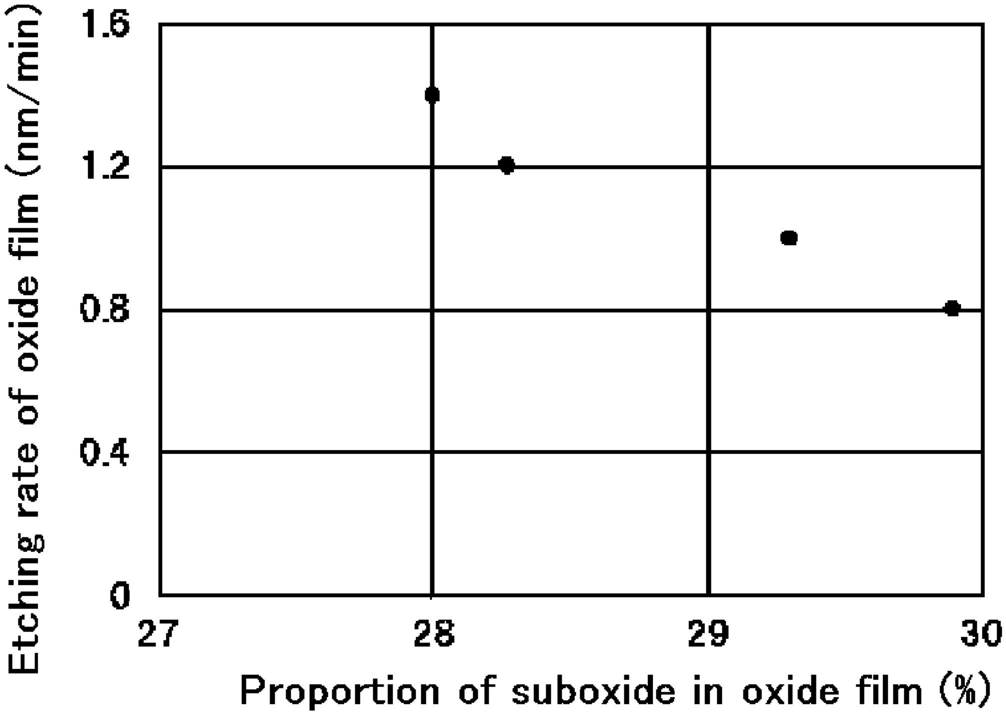

[FIG. 23]
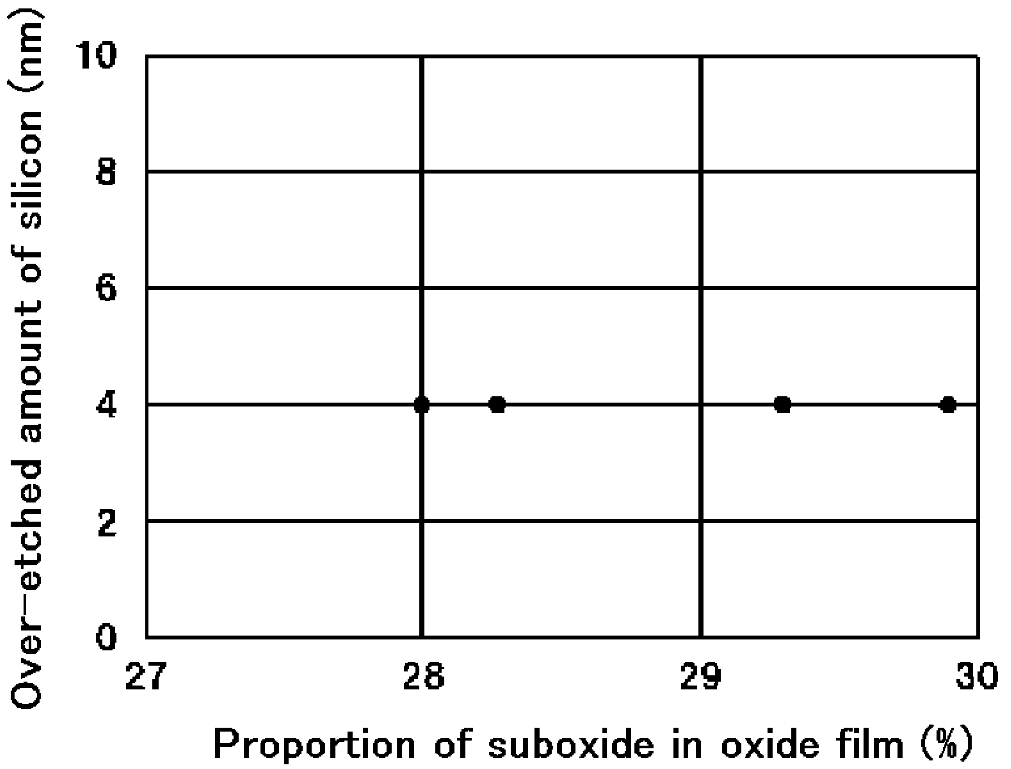
[FIG. 24]
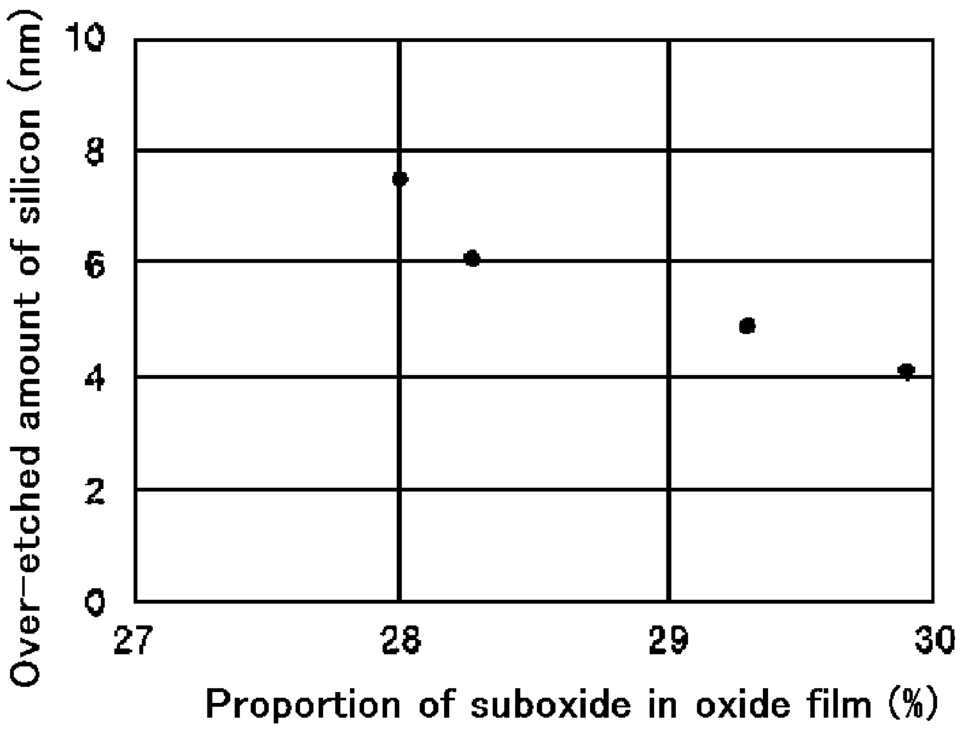

METHOD FOR DRY-ETCHING SEMICONDUCTOR SUBSTRATE AND METHOD FOR DRY-ETCHING SILICON OXIDE FILM

TECHNICAL FIELD

The present invention relates to: a method for dry-etching a semiconductor substrate by which an oxide film on a surface of the semiconductor substrate is removed by dry etching; and a method for dry-etching a silicon oxide film by which a silicon oxide film on a surface of the silicon substrate is removed by dry etching.

BACKGROUND ART

Accompanying miniaturization of devices, thinning of formed films is progressing. Meanwhile, in dry etching using plasma, it is required to perform etching with little variation while maintaining the selectivity between a film to be etched and a substrate to be an underlying substrate accompanying the thinning of films. However, when a silicon wafer is processed, there is a variation in the over-etched amount of silicon depending on the wafer.

To counter such a problem, for example, Patent Document 1 discloses a method for determining the end point of etching. According to the method, a plurality of films to be etched are formed beforehand, each of the films to be etched are subjected to an etching treatment to measure the time required to complete the etching treatment, and the end point of etching is determined by using the time required to complete the etching treatment of each film. In this method, samples are prepared, reproducing some situations, for example, a situation where there is a film such as a natural oxide film between the film to be etched and the substrate in addition to the influence of thickness, then the relationship between time and etching rate is expressed as a function, and the end point of etching is defined.

In addition, as dry etching that takes into consideration the effects of such a natural oxide film, the following method is disclosed, for example, as in Patent Document 2: by monitoring the pressure in the chamber, a change in the type of the film to be etched is detected from a change in the pressure when the film to be etched changes from a natural oxide film to polysilicon, and the etching is controlled.

CITATION LIST

Patent Literature

Patent Document 1: JP H5-315317 A
Patent Document 2: JP 2003-001598 A

SUMMARY OF INVENTION

Technical Problem

In order to find a cause for the occurrence of variation in the over-etched amount, the present inventors have focused on the film thickness of oxide films and investigated the relationship between the thickness of a natural oxide film on a silicon wafer or the thickness of a chemical oxide film formed by cleaning and the over-etched amount. However, no correlation was observed between the film thickness of an oxide film and the over-etched amount, and it was difficult to control dry etching parameters appropriately.

Determining the end point of etching as described in Patent Document 1 is an effective means. However, it is necessary to prepare, in advance, film qualities and film structures expected to affect the etching. In addition, means for grasping what will affect the etching when preparing the samples are not disclosed.

The monitoring of an etching process as described in Patent Document 2 is very effective. However, in Patent Document 2, the gas pressure is monitored to maintain a constant pressure, a film to be etched is etched, and the fluctuation in pressure that occurs when the underlying substrate of the film to be etched has been reached is captured and defined as the end point of etching. When the film to be etched is thinned and the etching rate is deliberately reduced in order to improve uniformity and so forth, this fluctuation in pressure is difficult to capture in some cases, and moreover, a fluctuation in pressure cannot be observed due to the thinning of the film to be etched in some cases. Furthermore, accompanying the miniaturization of semiconductor devices, control of the etching amount also becomes tight. Therefore, it can be considered that it is extremely important to grasp the original properties of the film to be etched (e.g. natural oxide film or chemical oxide film) and control the etching parameters in advance before performing the etching. In particular, when dry-etching a silicon oxide film formed on a silicon substrate, it is necessary to clarify the factors that have an effect on the etching properties and control the etching.

The present invention has been made to solve the problems, and an object thereof is to provide a method for suppressing over-etching and insufficient etching by controlling the etching amount of an oxide film accurately when dry-etching an oxide film on a surface of a semiconductor substrate or a silicon oxide film on a surface of a silicon substrate.

Solution to Problem

The present invention has been made to achieve the object, and provides a method for dry-etching a semiconductor substrate having an oxide film, comprising:

evaluating a film quality of the oxide film and determining a time for performing the dry-etching on a basis of results of the evaluation in advance.

According to such a method for dry-etching a semiconductor substrate, the etching amount of the oxide film can be controlled accurately without influence from the difference in the film quality of the oxide film formed on the surface, so that over-etching and insufficient etching can be suppressed when dry-etching the oxide film.

The present invention also provides a method for dry-etching a semiconductor substrate having an oxide film, comprising:

evaluating a film quality of the oxide film by a channeling mode of RBS (Rutherford Backscattering Spectroscopy) and determining a time for performing the dry-etching on a basis of results of the evaluation in advance.

According to such a method for dry-etching a semiconductor substrate, the film quality of the oxide film formed on the surface can be evaluated accurately and the etching amount of the oxide film can be controlled accurately without influence from the difference in the film quality, so that over-etching and insufficient etching can be suppressed when dry-etching the oxide film.

In this event, a distribution of crystallinity in a depth direction of the oxide film and/or a proportion of constituent elements of the oxide film is preferably evaluated as the film quality.

By evaluating the distribution of crystallinity in the depth direction of the oxide film or the proportion of constituent elements of the oxide film evaluated by RBS and setting the dry-etching conditions on the basis of the evaluation results, a more accurate time for performing the dry-etching can be determined.

In this event, the oxide film is preferably a natural oxide film or a chemical oxide film.

A thin oxide film such as a natural oxide film due to storage in the atmosphere or a chemical oxide film due to cleaning is usually formed on a surface of a semiconductor substrate. According to the inventive method for dry-etching a semiconductor substrate, over-etching and insufficient etching can be suppressed particularly effectively when the dry-etching is performed on such a natural oxide film or chemical oxide film.

In this event, the semiconductor substrate is preferably a silicon substrate and the oxide film is preferably a silicon oxide film.

The inventive method for dry-etching a semiconductor substrate is suitable for a silicon oxide film formed on a silicon substrate.

The present invention also provides a method for dry-etching a silicon oxide film to remove a silicon oxide film on a surface of a silicon substrate by dry etching, the method comprising:

- providing a plurality of silicon substrates each having a silicon oxide film $SiO_x$ having a different oxygen proportion (x) provided that $0<x\leq 2$, obtaining an index indicating the oxygen proportion (x) regarding each silicon oxide film of the plurality of silicon substrates and etching each silicon oxide film of the plurality of silicon substrates under identical dry-etching conditions, and determining a correlation between the index indicating the oxygen proportion (x) and etching rate;
- obtaining an index indicating the oxygen proportion (x) regarding a silicon oxide film on a silicon substrate to be etched; and
- determining an etching time based on the index indicating the oxygen proportion (x) of the silicon oxide film on the silicon substrate to be etched and the correlation and dry-etching the silicon oxide film of the silicon substrate to be etched.

According to such a method for dry-etching a silicon oxide film, the etching amount of the silicon oxide film can be controlled with high precision. As a result, it is also possible to prevent over-etching and insufficient etching from occurring and to control the amount of over-etching with high precision.

In this event, the method can be a method for dry-etching a silicon oxide film where the index indicating the oxygen proportion (x) is one or more selected from a density of $SiO_x$ measured by XRR (X-ray reflectometry), a peak wave number of an infrared absorption spectrum around a wave number of 1050 $cm^{-1}$ obtained by a transmission FT-IR method, a proportion of suboxide $SiO_x$ to $SiO_2$ measured by XPS (X-ray photoelectron spectroscopy), provided that $0<x<2$, or a proportion of constituent elements of the silicon oxide film measured by RBS (Rutherford Backscattering Spectroscopy).

Such measurement methods are simple methods, and the film quality of the oxide film can be evaluated with high precision, so that the etching amount of the silicon oxide film can be controlled with higher precision.

In this event, the silicon oxide film can be a natural oxide film or a chemical oxide film.

The inventive method for dry-etching a silicon oxide film is particularly effective when etching such a thin oxide film.

Advantageous Effects of Invention

As described above, according to the inventive method for dry-etching a semiconductor substrate, the variation in the film quality of an oxide film that affects the dry etching is grasped in advance, and the etching amount of the oxide film can be controlled accurately in accordance with the film quality to suppress over-etching and insufficient etching. In particular, the etching amount of the oxide film can be controlled accurately to suppress over-etching and insufficient etching even when the cleaning conditions are unknown and the film quality and so forth of the oxide film is unknown. Furthermore, according to the inventive method for dry-etching a silicon oxide film, the etching amount of a silicon oxide film can be controlled with high precision by considering the effects of the film quality. As a result, it is possible to prevent over-etching and insufficient etching from occurring and the amount of over-etching can be controlled. Moreover, dry etching with little variation is possible.

BRIEF DESCRIPTION OF DRAWINGS

FIG. 1 shows a flow of a method for dry-etching a semiconductor substrate according to the first embodiment of the present invention.

FIG. 2 is a graph showing the relationship between the proportion of oxygen atoms in a silicon oxide film and the etching rate of the silicon oxide film.

FIG. 3 is a diagram explaining an example of a typical RBS measurement.

FIG. 4 shows a flow of a method for dry-etching a silicon oxide film according to the third embodiment of the present invention.

FIG. 5 shows an outline of a method for evaluating a semiconductor substrate by XRR (X-ray reflectometry).

FIG. 6 shows an outline of a method for evaluating a semiconductor substrate by a transmission FT-IR method.

FIG. 7 is a graph showing the over-etched amount of silicon directly below a chemical oxide film after etching when dry-etching is performed, the film quality of the silicon oxide film having been grasped and the time for performing the dry-etching having been adjusted beforehand.

FIG. 8 is a graph showing the evaluation results of a distribution of crystallinity in a depth direction of a chemical oxide film after SC1 cleaning, the evaluation being carried out by RBS.

FIG. 9 is a graph showing the evaluation results of a distribution of crystallinity in a depth direction of a chemical oxide film after $O_3$ cleaning, the evaluation being carried out by RBS.

FIG. 10 is a graph showing the evaluation results of a proportion of constituent elements of a chemical oxide film after SC1 cleaning, the evaluation being carried out by RBS.

FIG. 11 is a graph showing the evaluation results of a proportion of constituent elements of a chemical oxide film after $O_3$ cleaning, the evaluation being carried out by RBS.

FIG. 12 is a graph showing the over-etched amount of silicon directly below a chemical oxide film after etching when dry-etching is performed without grasping the film quality of the silicon oxide film.

FIG. 13 shows the relationship between cleaning conditions ($NH_4OH$ concentration) and the density of $SiO_x$ determined by XRR.

FIG. 14 shows the relationship between the density of a silicon oxide film and etching rate.

FIG. 15 shows the relationship between the density of a silicon oxide film and the amount of over-etched silicon in Example 2.

FIG. 16 shows the relationship between the density of a silicon oxide film and the amount of over-etched silicon in Comparative Example 2.

FIG. 17 shows the relationship between cleaning conditions ($NH_4OH$ concentration) and a peak wave number of an infrared absorption spectrum that appears around 1050 $cm^{-1}$ and corresponds to Si—O—Si stretching vibration, determined by a transmission FT-IR method.

FIG. 18 shows the relationship between a peak wave number of an infrared absorption spectrum that appears around 1050 $cm^{-1}$ and corresponds to Si—O—Si stretching vibration and etching rate.

FIG. 19 shows the relationship between a peak wave number of an infrared absorption spectrum that appears around 1050 $cm^{-1}$ and corresponds to Si—O—Si stretching vibration and an over-etched amount of silicon in Example 3.

FIG. 20 shows the relationship between a peak wave number of an infrared absorption spectrum that appears around 1050 $cm^{-1}$ and corresponds to Si—O—Si stretching vibration and an over-etched amount of silicon in Comparative Example 3.

FIG. 21 shows the relationship between cleaning conditions ($NH_4OH$ concentration) and a proportion of suboxide ($SiO_x$, provided that $0<x<2$) to $SiO_2$ measured by XPS (X-ray photoelectron spectroscopy).

FIG. 22 shows the relationship between a proportion of suboxide in a silicon oxide film and etching rate.

FIG. 23 shows the relationship between a proportion of suboxide in a silicon oxide film and the amount of over-etched silicon in Example 4.

FIG. 24 shows the relationship between a proportion of suboxide in a silicon oxide film and the amount of over-etched silicon in Comparative Example 4.

DESCRIPTION OF EMBODIMENTS

Hereinafter, the present invention will be described in detail, but the present invention is not limited thereto.

As described above, there has been desired a method for controlling the etching amount of an oxide film accurately and suppressing over-etching and insufficient etching regardless of variation in the film quality of the oxide film that affects the etching and by grasping the variation in film quality accurately when dry-etching an oxide film on a semiconductor substrate surface or a silicon oxide film on a silicon substrate surface.

The present inventors have earnestly studied the problem and found out that according to a method for dry-etching a semiconductor substrate having an oxide film, including: evaluating a film quality of the oxide film and determining a time for performing the dry-etching on a basis of results of the evaluation in advance, the etching amount of the oxide film can be controlled accurately and over-etching and insufficient etching can be suppressed when dry-etching the oxide film without influence from variation in the film quality of the oxide film formed on the surface. Thus, the present invention has been completed.

The present inventors have also found out that when dry-etching an oxide film, the film quality of the oxide film formed on a surface can be evaluated accurately and the etching amount of the oxide film can be controlled accurately so that over-etching and insufficient etching can be suppressed without being influenced by variation in the film quality according to a method for dry-etching a semiconductor substrate having an oxide film, including: evaluating a film quality of the oxide film by a channeling mode of RBS (Rutherford Backscattering Spectroscopy) and determining a time for performing the dry-etching on a basis of results of the evaluation in advance. Thus, the present invention has been completed.

The present inventors have further found out that the etching amount of a silicon oxide film can be controlled with high precision and that, as a result, over-etching and insufficient etching can be prevented from occurring and an over-etched amount can be controlled with high precision according to a method for dry-etching a silicon oxide film to remove a silicon oxide film on a surface of a silicon substrate by dry etching, the method including:

providing a plurality of silicon substrates each having a silicon oxide film $SiO_x$ having a different oxygen proportion (x) provided that $0<x\leq 2$, obtaining an index indicating the oxygen proportion (x) regarding each silicon oxide film of the plurality of silicon substrates and etching each silicon oxide film of the plurality of silicon substrates under identical dry-etching conditions, and determining a correlation between the index indicating the oxygen proportion (x) and etching rate;

obtaining an index indicating the oxygen proportion (x) regarding a silicon oxide film on a silicon substrate to be etched; and determining an etching time based on the index indicating the oxygen proportion (x) of the silicon oxide film on the silicon substrate to be etched and the correlation and dry-etching the silicon oxide film of the silicon substrate to be etched. Thus, the present invention has been completed.

First Embodiment

Below, firstly, a method for dry-etching a semiconductor substrate according to the first embodiment of the present invention will be described with reference to the figures.

As described above, when dry-etching a semiconductor substrate having an oxide film, in particular, when dry-etching a semiconductor substrate having a thin oxide film such as a natural oxide film or a chemical oxide film, there is variation in the amount of over-etched silicon. The present inventors have found out that this variation does not depend on the film thickness, and focused on the film quality of the oxide film. Thus, the present inventors have found out that the etching amount of the oxide film can be controlled accurately so that over-etching and insufficient etching can be suppressed by evaluating the film quality of the oxide film and determining the time for performing the dry-etching in advance as shown in FIG. 1.

Second Embodiment

Next, a method for dry-etching a semiconductor substrate according to the second embodiment of the present invention will be described with reference to the figures.

As described above, when dry-etching a semiconductor substrate having an oxide film, in particular, when dry-etching a semiconductor substrate having a thin oxide film such as a natural oxide film or a chemical oxide film, there is variation in the amount of over-etched silicon. The present inventors have found out that this variation does not depend on the film thickness, and earnestly conducted an investigation, focusing on the film quality of the oxide film. As a result, the present inventors have found out that the film quality of the oxide film can be evaluated simply and accurately by evaluating the film quality of the oxide film by employing Rutherford Backscattering Spectroscopy.

Thus, by adopting the above-described evaluation method, it has become possible to evaluate the film quality (crystallinity, proportion of constituent elements, etc.) of an oxide film, in particular, an oxide film such as a natural oxide film or a chemical oxide film of a semiconductor substrate simply and accurately. For example, when the oxide film to be processed (dry-etched) is a natural oxide film or a chemical oxide film, it has become possible to discern whether the oxide film is a natural oxide film or chemical oxide film that has an amorphous structure and is stoichiometric, such as a thermal oxide film, or whether the oxide film is a natural oxide film or chemical oxide film that has a crystalline structure and that deviates from stoichiometry (generally silicon-rich). Thus, the present inventors have found out that by determining the time for performing the dry-etching on the basis of the evaluation results, the etching amount of the oxide film can be controlled, and over-etching and insufficient etching can be suppressed.

FIG. 3 shows an outline of a method for evaluating an oxide film on a semiconductor substrate in the method for dry-etching a semiconductor substrate according to the second embodiment of the present invention, and is a diagram for describing an example of measurement by a typical Rutherford Backscattering Spectroscopy (Rutherford Backscattering Spectorometory) method (hereinafter, also referred to as “RBS”). In the evaluation of the film quality of the oxide film according to the present invention, probe ions (light ions of helium ($He^+$), hydrogen ($H^+$), etc.) accelerated by an accelerator 2 to have high energy are driven into a surface of a semiconductor substrate 1, and the probe ions undergo Rutherford scattering caused by the atomic nuclei of atoms 5 constituting the crystal in the semiconductor substrate 1. The direction of progress of the scattered probe ions is bent and the probe ions progress in a direction of progress 7. RBS is an analysis method according to which it is possible to find the spectral components of energy and the number of ions by using a quadrupole mass spectrometer 3 and a position transducer 4 when the probe ions are released in the opposite direction (backwards) to determine the mass and density of the atomic nuclei in the semiconductor substrate 1 that caused the scattering and determine the place (depth from the surface) where the atomic nuclei exist. By performing the analysis by a channeling mode of RBS in this event, the film quality can be evaluated with high precision.

Meanwhile, when the probe ions are made to enter along the crystal axis direction, channeling of the probe ions occurs, and the probe ions progress in a direction of progress 6. By making use of this channeling property, it is possible to evaluate the distribution of crystallinity in a depth direction of the oxide film of the semiconductor substrate 1 to be evaluated.

Here, the channeling mode will be described. Ions that enter a sample and advance into the crystal are scattered by interstitial atoms and impurity atoms. Ions that entered along the crystal axis direction (these are referred to as ions that entered under channeling conditions) do not approach atoms in interstitial positions, and therefore, backscattering does not occur. However, as the ions advance inside the crystal, the ions are affected by multiple scattering caused by electrons inside the crystal and deviate from the channeling conditions (dechanneling), cause wide-angle scattering, and are eventually scattered backwards. On the other hand, in the case of ions that enter without taking the crystal axis direction into account or when the object is not a crystal, the ions are immediately scattered by the atoms. Evaluation of crystallinity employing RBS (channeling mode) is performed by comparing conditions under which high-energy ions enter along the crystal axis (channeling conditions) with conditions that do not depend on crystallinity due to sample rotation (random conditions).

When probe ions enter along the direction in which the crystal array is arranged, the probe ions reach a deep part of the sample without scattering, so that the amount of scattered probe ions is small. However, small angle scattering occurs, and the detected energy varies depending on the depth at which the probe ions scattered. Since this difference in energy corresponds to the depth, it is possible to evaluate the state of the crystalline structure in a depth direction (the distribution of crystallinity in a depth direction).

In addition, a spectrum obtained by RBS has, on a horizontal axis, a scattering energy released by the incident probe ions being scattered by atomic nuclei in the semiconductor substrate, and on a vertical axis, the yield. In this event, the scattering energy varies depending on the type of the scattered element or the depth from the surface. Therefore, if a plurality of elements are contained in the semiconductor substrate at the same depth, a different energy is respectively detected. In this manner, the proportion of constituent elements can be evaluated.

The semiconductor substrate to be dry-etched is not particularly limited, but is preferably a silicon substrate. In this case, the oxide film to be dry-etched is preferably a silicon oxide film.

Furthermore, in the dry-etching method according to the second embodiment of the present invention, it is possible to evaluate the difference in film thickness accurately, in particular, regarding a thin oxide film such as a natural oxide film or a chemical oxide film. Therefore, such an oxide film is suitable and preferable as the object of the dry-etching.

Dry-etching was performed on a silicon oxide film on a surface of a semiconductor silicon substrate whose film quality had been evaluated, and it has been found that there is a relationship between the average proportion of oxygen atoms at a depth of 0.5 to 1.0 nm where the film quality in the oxide film changes and the etching rate of the oxide film. FIG. 2 is a graph showing the relationship between the proportion of oxygen atoms in a silicon oxide film and the etching rate of the silicon oxide film. By evaluating the oxide film quality in advance and optimizing the etching time by using the results shown in FIG. 2, it is possible to suppress variation in etching amount and prevent over-etching of, particularly, an underlying semiconductor substrate.

As described above, the etching time can be adjusted to be optimum by carrying out an evaluation beforehand by employing RBS and evaluating and grasping the difference in the film quality that affects the etching rate, in particular, the difference in structure and composition. Thus, it is possible to enhance the controllability of the dry etching. For example, even when the cleaning conditions are unknown and the film quality or the like of the oxide film is unknown, it is possible to control the etching amount of the oxide film accurately and suppress over-etching and insufficient etching.

Third Embodiment

Next, a method for dry-etching a silicon oxide film according to the third embodiment of the present invention will be described with reference to the figures.

Regarding dry-etching of a silicon oxide film formed on a silicon substrate, the present inventors have clarified factors that influence etching properties and earnestly conducted an investigation with the aim of controlling etching. As a result, the present inventors have found out that in plasma etching, since conditions are set so that the selectivity of the film to be etched is large, the etching rate alters if the composition of the silicon oxide film deviates from a stoichiometric composition. Specifically, when the silicon oxide film on the silicon substrate has a high density, the silicon oxide film is a stoichiometric silicon oxide film, and is easily etched. In addition, it has also been found that when the composition of the silicon oxide film deviates from a stoichiometric ratio, the silicon component is large, and the etching rate alters.

This influence is considered to occur in the following situation. As a means for detecting an end point of etching, equipment known as an end point detector is generally provided. This detector makes use of a phenomenon that a light emission wavelength of plasma varies depending on the object to be etched, and detects the end point of etching from a change in the wavelength of plasma due to the film to be etched being eliminated and the underlying substrate or film being exposed. Thus, it is possible to confirm the end point of etching by using an end point detector even when the film thickness has changed. However, since the change is observed in the light emission wavelength, a difference occurs in the over-etched amount of the underlying substrate due to a slight difference in etching time, causing steps, even when the time required for the change in wavelength is short in the case of a thin oxide film or the like. This effect is considered to have a great influence particularly in advanced devices, whose miniaturization has advanced and in which thin films are often used. Accordingly, it is effective to investigate the structure of the thin film in advance and grasp the relationship with etching time. In particular, natural oxide films and chemical oxide films are extremely thin films, and in addition, the film composition, in particular, the oxygen proportion (x) varies depending on the conditions under which the oxide film is formed, so that the advantageous effects when the inventive method for dry-etching a silicon oxide film is applied are remarkable.

FIG. 4 shows a flow of the method for dry-etching a silicon oxide film according to the third embodiment of the present invention.

Firstly, in order to determine a correlation between an index indicating the oxygen proportion (x) and etching rate, a plurality of silicon substrates are prepared, each having a silicon oxide film ($SiO_x$, provided that $0<x\leq2$) having a different oxygen proportion (x). In this event, as the silicon oxide films having different oxygen proportions (x), for example, it is possible to use those in which a chemical oxide film is formed by cleaning a silicon substrate under altered cleaning conditions such as the type or concentration of the chemical solution, those in which an oxide film is formed by oxidization by a heat treatment or the like, a silicon substrate having a natural oxide film formed, or the like.

Next, regarding the silicon oxide films of the prepared silicon substrates, an index indicating the oxygen proportion (x) is obtained. The index indicating the oxygen proportion (x) of the silicon oxide film ($SiO_x$, provided that $0<x\leq2$) according to the present invention is not particularly limited as long as the index is a parameter that can reflect the difference in the oxygen proportion (x) of the silicon oxide film. It is possible to measure the actual proportion of Si and O by SIMS or the like and use the proportion as an index indicating the oxygen proportion (x). However, in the etching method according to the third embodiment of the present invention, it is sufficient to know the order of oxygen proportions (x) according to size, and it is preferable to perform an evaluation by performing one or more measurements from the measurement methods described below from the viewpoint that it is possible to obtain an index indicating the oxygen proportion (x) of the silicon oxide film comparatively easily and with high precision.

FIG. 5 shows an outline of a method for evaluating a semiconductor substrate by XRR (X-ray reflectometry) related to the present invention. XRR is a method of: allowing an X-ray from an X-ray source 13 to enter (incident X-ray 16) a semiconductor substrate 1, on a surface of which a thin film 12 is formed, diagonally at a predetermined incidence angle 15; detecting a reflected X-ray 17 of the X-ray with an X-ray detector 14; and obtaining information on the surface of the semiconductor substrate 1 or the thin film 12 on the semiconductor substrate 1 from the intensity and angle of the reflected X-ray 17. Since the angle at which total reflection of the X-ray occurs (critical angle) varies depending on the density of the thin film 12 on the surface of the semiconductor substrate 1, it is possible to determine the density of the thin film 12. By measuring a silicon substrate as the semiconductor substrate 1 having a silicon oxide film such as a natural oxide film or a chemical oxide film formed as the thin film 12 in the above manner, the obtained density of the thin film 12 (silicon oxide film) can be taken as an index indicating the oxygen proportion (x) according to the present invention. Note that there is a relationship that as the density of the silicon oxide film increases, the oxygen proportion (x) in the silicon oxide film increases.

FIG. 6 shows an outline of a method for evaluating a semiconductor substrate by a transmission FT-IR method. A transmission FT-IR method is a method of: irradiating a semiconductor substrate 1 having a thin film 12 formed on a surface thereof with an infrared ray from an infrared ray source 18 (incident infrared ray 20) to allow the infrared ray to be transmitted through the thin film 12 and the semiconductor substrate 1; and detecting a transmitted infrared light 21 with an infrared detector 19. In particular, a peak wave number of an infrared absorption spectrum around 1050 $cm^{-1}$ derived from a stretching vibration mode of Si—O—Si bonds is known to shift to a higher wave number when the oxygen proportion (x) in the silicon oxide film is high (that is, the oxide film density is high). For this reason, it is possible to use the peak wave number of the infrared absorption spectrum around the wave number of 1050 $cm^{-1}$ obtained by the transmission FT-IR method as an index indicating the oxygen proportion (x) according to the present invention.

In addition, as described above, since conditions are set so as to achieve a high selectivity of the film to be etched in plasma etching, the etching rate changes if the film composition deviates from the stoichiometric composition. That is, when the proportion of suboxide increases, the proportion of the silicon component in the silicon oxide film increases, and the etching rate changes. Thus, it is possible to discern, by an advance evaluation by XPS before the dry etching, whether the film quality of a silicon oxide film such as a natural oxide film or a chemical oxide film is a stoichiometric oxide film, where $Si^{4+}$, corresponding to $SiO_2$ takes up most of the oxide film or whether the silicon oxide film is suboxide (an oxide film $SiO_x$ that does not reach the stoichiometric proportion, where 0<x<2, i.e. $Si^{1+\ to\ 3+}$). The proportion of the suboxide ($SiO_x$, provided that 0<x<2) to the $SiO_2$ measured by XPS (X-ray photoelectron spectroscopy) can be used as an index indicating the oxygen proportion (x), the proportion reflecting such a fine structure or film quality of a natural oxide film or chemical oxide film on a surface of a silicon substrate.

The proportion of constituent elements of a silicon oxide film measured by RBS (Rutherford Backscattering Spectroscopy) can also be used as an index indicating the oxygen proportion (x). The type of the element and the composition thereof can be analyzed from scattering energy of He in RBS measurement to calculate the proportion of oxygen. Specifically, the fact that a silicon oxide film has a crystalline structure corresponds to the fact that the proportion of oxygen is low, and the fact that a silicon oxide film has an amorphous structure means that the proportion of oxygen is high and is close to the stoichiometric proportion of $SiO_2$. Such a relationship can also be utilized.

By evaluating the film quality beforehand in this manner, it is possible to discern whether an oxide film such as a natural oxide film or a chemical oxide film is a film that has an amorphous structure and is stoichiometric, like a thermal oxide film, or a film that has a low content of oxygen, different from the stoichiometric composition. Such differences in structure and composition has an effect on etching rate, and by evaluating and grasping the fine structure of a natural oxide film or chemical oxide film on a surface of a silicon substrate in this manner, controllability of dry etching can be improved.

After obtaining the index representing the oxygen proportion (x) in the silicon oxide film of the plurality of prepared silicon substrates, the silicon oxide film of each of the plurality of prepared silicon substrates are etched under identical dry-etching conditions, and the etching rate is respectively calculated. The correlation between the index representing oxygen proportion (x) and the etching rate is determined from the data obtained in this manner.

Note that the sample used to obtain an index indicating the oxygen proportion (x) and the sample to be etched when obtaining the correlation may be the same sample (the sample that has been measured for obtaining an index of the oxygen proportion (x) is etched), or a plurality of samples of the same level may be prepared and divided into samples for obtaining an index indicating the oxygen proportion (x) and samples to be etched. The same can be applied to the silicon substrate to be etched as well.

Next, regarding the silicon oxide film of the silicon substrate to be actually etched, an index indicating the oxygen proportion (x) is obtained in the same manner as the obtention of the correlation.

The index indicating the oxygen proportion (x) regarding the silicon oxide film of the silicon substrate to be etched determined as described above can be applied to the above correlation to estimate the etching rate. Thus, on the basis of the etching rate, the etching time can be determined to achieve the desired etching amount. In this manner, etching can be performed in such a manner that the target etching amount can be achieved regardless of variation in film quality (oxygen proportion (x)). Therefore, it is possible to prevent over-etching and insufficient etching from occurring and to control the amount of over-etching with high precision.

EXAMPLE

Hereinafter, the present invention will be described specifically with reference to Examples, but the present invention is not limited thereto.

Experimental Example

Two boron-doped silicon wafers having a diameter of 300 mm and a usual resistivity were prepared, and after cleaning the surface of the first silicon wafer with 0.5% HF (diluted hydrofluoric acid) for initialization, ordinary SC1 cleaning was performed at 70° C. Furthermore, in the same manner, the surface of the second silicon wafer was cleaned with 0.5% HF (diluted hydrofluoric acid) for initialization, and then ordinary $O_3$ cleaning was performed at 24° C. Regarding each of the prepared and cleaned wafers, the distribution of crystallinity in a depth direction and the proportion of constituent elements were determined by a channeling mode of RBS ($He^+$, 450 keV).

FIG. 8 and FIG. 9 are graphs that show the results of the evaluation of the distribution of crystallinity in a depth direction of the cleaned chemical oxide film by RBS. FIG. 8 shows a chemical oxide film after SC1 cleaning, FIG. 9 shows a chemical oxide film after $O_3$ cleaning, and the parts painted over in black in FIG. 8 and FIG. 9 are the silicon oxide films (the thickness of the oxide films was determined by spectroscopic ellipsometry). In FIG. 8 and FIG. 9, the horizontal axis shows the depth from the surface of the silicon wafer and the vertical axis shows the channeling coefficient of He ions and the rate of change of the channeling coefficient. When the channeling coefficient is 100, this indicates that the silicon oxide film is in an amorphous state (not crystalline), and when 0, this indicates that the silicon oxide film has a crystalline structure.

Looking at the example in which SC1 cleaning was performed, the channeling coefficient was 100 at the surface of the silicon oxide film on the silicon wafer as shown in FIG. 8, and this indicates that the silicon oxide film was in an amorphous state. Between a depth of about 0.5 nm from the surface and the silicon oxide film/silicon wafer interface, the channeling coefficient changes, and is 40 to 60. This indicates that a crystal state is exhibited in the region deeper than 0.5 nm from the surface of the silicon oxide film.

Meanwhile, looking at the example in which $O_3$ cleaning was performed, the channeling coefficient was 100 and constant in the silicon oxide film on the silicon wafer as shown in FIG. 9, and this indicates that the state of the silicon oxide film is an amorphous state regardless of the depth from the surface. In addition, the channeling coefficient does not change in the silicon oxide film, and the channeling coefficient changes in the silicon oxide film/silicon wafer interface. This indicates that a crystalline structure cannot be observed in the silicon oxide film formed by $O_3$ cleaning.

Meanwhile, FIG. 10 and FIG. 11 are graphs that show the results of the evaluation of the proportion of the constituent elements of the cleaned chemical oxide film by RBS. FIG. 10 shows a chemical oxide film after SC1 cleaning, and FIG. 11 shows a chemical oxide film after $O_3$ cleaning. It was observed that the proportion of the constituent elements of the chemical oxide film formed by the cleaning varies depending on the cleaning conditions, and furthermore, that the proportion of the elements constituting the chemical oxide film changes depending on the depth from the surface even under the same cleaning conditions. It was observed that the amount of oxygen atoms decreased from the position at a depth of 0.5 nm from the surface of the oxide film to the silicon wafer/silicon oxide film interface, and that the decreased amount of oxygen varies due to the difference between the conditions of the SC1 cleaning and the conditions of the $O_3$ cleaning.

Next, dry etching was performed with a plasma treatment apparatus (microwave ECR etching apparatus). The etching conditions were set to gas: $HBr/Cl_2/He/O_2$=30/15/5.8/0.2 (sccm),
pressure: 170 Pa,
RF output: 310 W,
magnetic field output: 50 W, and
etching time: 1 minute.

When wafers having different proportions of oxygen atoms in the silicon oxide film thereof were subjected to dry etching, it was observed that there was a relationship between the proportion of oxygen atoms in the silicon oxide film and the etching rate. Here, a study was conducted on the basis of the average proportion of oxygen atoms in the silicon oxide film at the depth where the change can be observed in the film quality of the chemical oxide film of the wafer subjected to SC1 cleaning, that is at the depth of 0.5 to 1.0 nm. FIG. 2 is a graph showing the relationship between the proportion of oxygen atoms in the silicon oxide film and the etching rate of the silicon oxide film. By evaluating the film quality of the silicon oxide film beforehand and using the results of FIG. 2, the etching time can be adjusted and determined to be the optimum, and therefore, it is possible to suppress the variation in etching amount due to the difference in the oxide film. In particular, it is possible to prevent the variation in the over-etched amount of the silicon substrate to be an underlying substrate.

Furthermore, it is also possible to carry out an evaluation, focusing on the distribution of the crystallinity in a depth direction as the change in the film quality of the oxide film and adjust the etching time in accordance with the change in crystallinity. For example, it is known that the etching rate in a case where the oxide film mainly has an amorphous structure is higher than the etching rate in a case where the oxide film has a crystalline structure, and by making use of this tendency, the etching time can be adjusted and determined to the optimum value.

Example 1

Four levels of silicon wafers each having a silicon oxide film of unknown film quality formed by cleaning were prepared. The etching conditions given in the Experimental Example were applied except that the film quality of the oxide film of each cleaned wafer was grasped in the same manner as in the Experimental Example and the etching time was determined in accordance with the film quality. The etching time of the wafer that had been evaluated as having the highest etching rate of the silicon oxide film was set to 45 seconds. The etching time was increased by 10 seconds, and the etching time was set to 75 seconds for the wafer having the lowest etching rate. Thus, dry-etching of the oxide films was performed. FIG. 7 is a graph showing the over-etched amount of silicon immediately below the chemical oxide film after etching. Thus, when the film quality of the silicon oxide film had been grasped, the time for performing the dry etching was adjusted in advance, and dry etching was performed, variation in the over-etched amount of silicon was successfully suppressed.

Comparative Example 1

Silicon wafers similar to those in Example 1 (four levels of silicon wafers each having a silicon film of unknown quality formed by cleaning) were prepared. Without evaluating the film quality attributable to cleaning, the etching conditions were set to the same conditions as in the Experimental Example, the etching time was set equally to 1 minute, and dry etching was performed. FIG. 12 is a graph showing the over-etched amount of silicon immediately below the chemical oxide film after etching in Comparative Example 1. As shown in FIG. 12, when the dry etching was performed without grasping the film quality of the silicon oxide film, variation occurred between the wafers in the over-etched amount of the underlying silicon wafer of the oxide film.

As described, it has been shown that, according to the inventive method for dry-etching a semiconductor substrate, the etching amount of the oxide film can be controlled accurately and over-etching and insufficient etching can be suppressed when dry-etching the oxide film.

Example 2

Four boron-doped silicon substrates having a diameter of 300 mm and a usual resistivity were prepared, and after cleaning the surface of the silicon substrates with 0.5% HF for initialization, SC1 cleaning was performed at 70° C. with the concentration of $NH_4OH$ in the SC1 solution made to vary. The $NH_4OH$ concentration in the SC1 solution was set to 0.01, 0.03, 0.3, and 3%. As a result of measurement by spectroscopic ellipsometry, the silicon oxide films formed by the cleaning had a film thickness of about 1 nm.

Next, as an index representing the oxygen proportion (x) in the chemical oxide film formed on the surface of each silicon substrate, the density of the silicon oxide film ($SiO_x$) was determined by XRR. As a result, as shown in FIG. 13, it was observed that, in the case of SC1 cleaning, there is a tendency that the higher the $NH_4OH$ concentration, the higher the oxide film density. This signifies the fact that the higher the $NH_4OH$ concentration, the higher the oxygen proportion (x) in the oxide film.

Next, distinctly from the above-described silicon substrates, etching was performed using a plasma treatment apparatus (microwave ECR etching apparatus) on silicon substrates each having a chemical oxide film formed on a surface with the concentration of $NH_4OH$ in the SC1 cleaning made to vary in the same manner as above. The etching conditions were set to gas: $HBr/Cl_2/He/O_2$=30/15/5.8/0.2 sccm
pressure: 170 Pa,
RF output: 310 W,
magnetic field output: 50 W, and
etching time: 1 minute.

As a result, it was observed that there was a correlation between the density of the silicon oxide film and the etching rate (speed) of the silicon oxide film as shown in FIG. 14.

Next, four levels of wafers each having a silicon oxide film of unknown film quality actually formed by cleaning were prepared, and the density of each silicon oxide film ($SiO_x$) after the cleaning was determined by XRR. From the density of the $SiO_x$ of each wafer, the etching rate was calculated on the basis of the above correlation. The etching time of the silicon substrate that had been estimated to have the highest etching rate of the silicon oxide film was set to 45 seconds. The etching time was increased by 10 seconds, and the etching time was set to 75 seconds for the silicon substrate estimated to have the lowest etching rate. Thus, etching was performed. Variation in the etching amount was evaluated by the over-etched amount of silicon substrate after the etching. As a result, variation in over-etched silicon was successfully suppressed as shown in FIG. 15.

As described, it can be observed that by evaluating the film quality of the silicon oxide film to be etched by XRR in advance, adjusting and determining the etching time on the basis of a correlation that has been obtained beforehand, and performing etching, it is possible to suppress variation in the etching, and in particular, to prevent over-etching of the underlying silicon.

Comparative Example 2

Regarding four levels of wafers each having a silicon oxide film of unknown film quality similar to those in Example 2, the etching time was set equally to 1 minute, and etching was performed without evaluating the difference in film quality (density of $SiO_x$) caused by the cleaning conditions. Note that, in order to compare with Example 2, silicon oxide films of wafers fabricated by the same treatments as the four levels of wafers were separately subjected to evaluation of the difference in film quality (density of $SiO_x$) (the same was also carried out for Comparative Examples 3 and 4). As a result, variation occurred in the over-etched amount of silicon below the oxide film due to the difference in the film quality of the silicon oxide film as shown in FIG. 16.

Example 3

Four boron-doped silicon substrates having a diameter of 300 mm and a usual resistivity were prepared, and after cleaning the surface of the silicon substrates with 0.5% HF for initialization, SC1 cleaning was performed at 70° C. with the concentration of $NH_4OH$ in the SC1 solution made to vary. The $NH_4OH$ concentration in the SC1 solution was set to 0.01, 0.03, 0.3, and 3%. As a result of measurement by spectroscopic ellipsometry, the silicon oxide films formed by the cleaning had a film thickness of about 1 nm.

Next, as an index representing the oxygen proportion (x) in the chemical oxide film formed on the surface of each silicon substrate, the peak wave number of the infrared absorption spectrum that appears around 1050 $cm^{-1}$, corresponding to Si—O—Si stretching vibration, was determined by a transmission FT-IR method. As a result, it was observed that the higher the $NH_4OH$ concentration, the further the wave number around 1050 $cm^{-1}$ shifts to a higher wave number in the case of SC1 cleaning, as shown in FIG. 17. This means that the higher this wave number, the higher the proportion (x) of oxygen in the oxide film, that is, the higher the density.

Next, distinctly from the above-described silicon substrates, etching was performed under the same conditions as in Example 2 by using a plasma treatment apparatus (microwave ECR etching apparatus) on silicon substrates each having a chemical oxide film formed on a surface with the concentration of $NH_4OH$ in the SC1 cleaning made to vary in the same manner as above. As a result, it was observed that there was a correlation between the peak wave number of the infrared absorption spectrum that appears near 1050 $cm^{-1}$ corresponding to the Si—O—Si stretching vibration and the etching rate (speed) of the silicon oxide film as shown in FIG. 18.

Next, four levels of wafers each having a silicon oxide film of unknown film quality actually formed by cleaning were prepared. Regarding each cleaned silicon oxide film, the peak wave number of the infrared absorption spectrum that appears around 1050 $cm^{-1}$, corresponding to Si—O—Si stretching vibration was determined by a transmission FT-IR method. From the peak wave number of the infrared absorption spectrum of each wafer, the etching rate was calculated on the basis of the above correlation. The etching time of the silicon substrate that had been estimated to have the highest etching rate of the silicon oxide film was set to 45 seconds. The etching time was increased by 10 seconds, and the etching time was set to 75 seconds for the silicon substrate estimated to have the lowest etching rate. Thus, etching was performed, and the over-etched amount was evaluated. As a result, variation in the over-etching of the silicon was successfully suppressed regardless of the film quality of the silicon oxide film as shown in FIG. 19.

As described, it can be observed that by evaluating the film quality of the silicon oxide film to be etched by a transmission FT-IR method in advance, adjusting and determining the etching time on the basis of a correlation that has been obtained beforehand, and performing etching, it is possible to suppress variation in the etching, and in particular, to prevent over-etching of the underlying silicon.

Comparative Example 3

Four levels of silicon substrates each having a silicon oxide film of unknown film quality actually formed by cleaning were prepared. Without evaluating the difference in film quality due to cleaning conditions, etching was performed with the etching time set equally to 1 minute. As a result, variation occurred in the over-etched amount of silicon below the silicon oxide film due to the difference in the film quality of the silicon oxide film as shown in FIG. 20.

Example 4

Four boron-doped silicon substrates having a diameter of 300 mm and a usual resistivity were prepared, and after cleaning the surface of the silicon substrates with 0.5% HF for initialization, SC1 cleaning was performed at 70° C. with the concentration of $NH_4OH$ in the SC1 solution made to vary. The $NH_4OH$ concentration in the SC1 solution was set to 0.01, 0.03, 0.3, and 3%. As a result of measurement by spectroscopic ellipsometry, the silicon oxide films formed by the cleaning had a film thickness of about 1 nm.

Next, as an index representing the oxygen proportion (x) in the chemical oxide film formed on the surface of each silicon substrate, the proportion of $Si^{1+\ to\ 3+}$, corresponding to a suboxide ($SiO_x$, provided that $0<x<2$), to $Si^{4+}$, corresponding to $SiO_2$, of the silicon oxide film was determined by XPS, and the relationship between the proportion and the $NH_4OH$ concentration during SC1 cleaning was determined. As a result, it was observed that the higher the $NH_4OH$ concentration, the lower the proportion of suboxide tended to be in the case of SC1 cleaning as shown in FIG. 21.

Next, distinctly from the above-described silicon substrates, etching was performed under the same conditions as in Example 2 by using a plasma treatment apparatus (microwave ECR etching apparatus) on silicon substrates each having a chemical oxide film formed on a surface with the concentration of $NH_4OH$ in the SC1 cleaning made to vary in the same manner as above. As a result, it was observed that there was a correlation between the proportion of suboxide determined by XPS and the etching rate (speed) of the silicon oxide film as shown in FIG. 22.

Next, four levels of wafers each having a silicon oxide film of unknown film quality actually formed by cleaning were prepared. Regarding each cleaned silicon oxide film, the proportion of suboxide to $SiO_2$ was determined by XPS (X-ray photoelectron spectroscopy). The etching rate was calculated on the basis of the proportion of the suboxide to the $SiO_2$ of each wafer and the above correlation. The etching time of the silicon substrate that had been estimated to have the highest etching rate of the silicon oxide film was set to 45 seconds. The etching time was increased by 10 seconds, and the etching time was set to 75 seconds for the silicon substrate estimated to have the lowest etching rate. Thus, etching was performed, and the over-etched amount was evaluated. As a result, variation in the over-etching of the silicon was successfully suppressed regardless of the film quality of the silicon oxide film as shown in FIG. 23.

As described, it can be observed that by evaluating the film quality of the silicon oxide film to be etched by XPS (X-ray photoelectron spectroscopy) in advance, adjusting and determining the etching time on the basis of a correlation that has been obtained beforehand, and performing etching, it is possible to suppress variation in the etching, and in particular, to prevent over-etching of the underlying silicon.

Comparative Example 4

Four levels of silicon substrates each having a silicon oxide film of unknown film quality actually formed by cleaning were prepared. Without evaluating the difference in film quality due to cleaning conditions, etching was performed with the etching time set equally to 1 minute. As a result, variation occurred in the over-etched amount of silicon below the silicon oxide film due to the difference in the film quality of the silicon oxide film as shown in FIG. 24.

As described above, according to the Examples of the present invention, variation in etching was successfully suppressed by evaluating the film quality of the silicon oxide film to be etched by a simple method beforehand, adjusting and determining the etching time on the basis of a correlation that has been obtained in advance, and performing the etching. It has also been demonstrated that when dry-etching an oxide film, the etching amount of the oxide film can be controlled accurately, and over-etching and insufficient etching can be suppressed.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for dry-etching a semiconductor substrate having an oxide film, comprising:

evaluating a film quality of the oxide film on the semiconductor substrate by a channeling mode of Rutherford Backscattering Spectroscopy and determining a time for performing the dry-etching on a basis of results of the evaluation in advance.

2. The method for dry-etching a semiconductor substrate according to claim 1, wherein a distribution of crystallinity in a depth direction of the oxide film is evaluated as the film quality.

3. The method for dry-etching a semiconductor substrate according to claim 1, wherein a proportion of constituent elements of the oxide film is evaluated as the film quality.

4. The method for dry-etching a semiconductor substrate according to claim 2, wherein a proportion of constituent elements of the oxide film is evaluated as the film quality.

5. The method for dry-etching a semiconductor substrate according to claim 1, wherein the oxide film is a natural oxide film due to storage in the atmosphere or a chemical oxide film due to cleaning.

6. The method for dry-etching a semiconductor substrate according to claim 2, wherein the oxide film is a natural oxide film due to storage in the atmosphere or a chemical oxide film due to cleaning.

7. The method for dry-etching a semiconductor substrate according to claim 3, wherein the oxide film is a natural oxide film due to storage in the atmosphere or a chemical oxide film due to cleaning.

8. The method for dry-etching a semiconductor substrate according to claim 4, wherein the oxide film is a natural oxide film due to storage in the atmosphere or a chemical oxide film due to cleaning.

9. The method for dry-etching a semiconductor substrate according to claim 1, wherein the semiconductor substrate is a silicon semiconductor substrate and the oxide film is a silicon oxide film.

10. The method for dry-etching a semiconductor substrate according to claim 2, wherein the semiconductor substrate is a silicon semiconductor substrate and the oxide film is a silicon oxide film.

11. The method for dry-etching a semiconductor substrate according to claim 3, wherein the semiconductor substrate is a silicon semiconductor substrate and the oxide film is a silicon oxide film.

12. The method for dry-etching a semiconductor substrate according to claim 4, wherein the semiconductor substrate is a silicon semiconductor substrate and the oxide film is a silicon oxide film.

13. The method for dry-etching a semiconductor substrate according to claim 5, wherein the semiconductor substrate is a silicon semiconductor substrate and the oxide film is a silicon oxide film.

14. The method for dry-etching a semiconductor substrate according to claim 6, wherein the semiconductor substrate is a silicon semiconductor substrate and the oxide film is a silicon oxide film.

15. The method for dry-etching a semiconductor substrate according to claim 7, wherein the semiconductor substrate is a silicon semiconductor substrate and the oxide film is a silicon oxide film.

16. The method for dry-etching a semiconductor substrate according to claim 8, wherein the semiconductor substrate is a silicon semiconductor substrate and the oxide film is a silicon oxide film.

17. A method for dry-etching a silicon oxide film to remove the silicon oxide film on a surface of a silicon semiconductor substrate by dry etching, the method comprising:

providing a plurality of silicon semiconductor substrates each having a silicon oxide film $SiO_x$ having a different oxygen proportion (x) provided that $0<x\leq 2$, obtaining an index indicating the oxygen proportion (x) regarding each silicon oxide film of the plurality of silicon semiconductor substrates and etching each silicon oxide film of the plurality of silicon semiconductor substrates under identical dry-etching conditions, and determining a correlation between the index indicating the oxygen proportion (x) and etching rate;

obtaining an index indicating the oxygen proportion (x) regarding a silicon oxide film on a silicon semiconductor substrate to be etched; and determining an etching time based on the index indicating the oxygen proportion (x) of the silicon oxide film on the silicon semiconductor substrate to be etched and the correlation; and dry-etching the silicon oxide film of the silicon semiconductor substrate to be etched.

18. The method for dry-etching a silicon oxide film according to claim 17, wherein the index indicating the oxygen proportion (x) is one or more selected from a density of $SiO_x$ measured by X-ray reflectometry, a peak wave number of an infrared absorption spectrum around a wave number of 1050 $cm^{-1}$ obtained by a transmission FT-IR method, a proportion of suboxide $SiO_x$ to $SiO_2$ measured by X-ray photoelectron spectroscopy, provided that $0<x<2$, or a proportion of constituent elements of the silicon oxide film measured by Rutherford Backscattering Spectroscopy.

19. The method for dry-etching a silicon oxide film according to claim 17, wherein the oxide film is a natural oxide film due to storage in the atmosphere or a chemical oxide film due to cleaning.

20. The method for dry-etching a silicon oxide film according to claim 18, wherein the oxide film is a natural oxide film due to storage in the atmosphere or a chemical oxide film due to cleaning.

* * * * *